(12) United States Patent
Sato et al.

(10) Patent No.: US 8,779,410 B2
(45) Date of Patent: Jul. 15, 2014

(54) RESISTANCE CHANGE MEMORY AND METHOD OF MANUFACTURING THE SAME

(75) Inventors: Motoyuki Sato, Yokohama (JP); Yoshiaki Asao, Kawasaki (JP); Takashi Obara, Yokohama (JP); Takashi Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 13/355,692

(22) Filed: Jan. 23, 2012

(65) Prior Publication Data

US 2013/0001506 A1    Jan. 3, 2013

(30) Foreign Application Priority Data

Jun. 29, 2011 (JP) .................................. 2011-144646

(51) Int. Cl.
*H01L 21/00* (2006.01)
*H01L 29/06* (2006.01)
*H01L 27/22* (2006.01)

(52) U.S. Cl.
CPC .................................. *H01L 27/228* (2013.01)
USPC ........................... 257/5; 257/E21.665; 438/3

(58) Field of Classification Search
USPC .......................................... 257/5; 438/382, 3
See application file for complete search history.

(56) References Cited

U.S. PATENT DOCUMENTS

| 6,475,857 | B1 * | 11/2002 | Kim et al. | 438/240 |
|---|---|---|---|---|
| 7,923,305 | B1 | 4/2011 | Nguyen et al. | |
| 2007/0099377 | A1 * | 5/2007 | Happ et al. | 438/257 |
| 2009/0155962 | A1 * | 6/2009 | Petti et al. | 438/129 |
| 2009/0166603 | A1 * | 7/2009 | Lung | 257/4 |
| 2011/0249488 | A1 * | 10/2011 | Juengling | 365/149 |
| 2013/0134506 | A1 * | 5/2013 | Yagishita | 257/330 |

FOREIGN PATENT DOCUMENTS

JP    2008-91537    4/2008

* cited by examiner

*Primary Examiner* — Matthew Landau
*Assistant Examiner* — Igwe U Anya
(74) *Attorney, Agent, or Firm* — Oblon, Spivak, McClelland, Maier & Neustadt, L.L.P.

(57) ABSTRACT

According to one embodiment, a resistance change memory includes resistance change elements, vias and sidewall insulating layers, the elements and the vias provided alternately in a first direction and a second direction orthogonal to the first direction, and the sidewall insulating layers provided on sidewalls of the elements. The elements are provided in a lattice pattern having a constant pitch. A thickness of each of the sidewall insulating layers in a direction orthogonal to the sidewalls is a value for contacting the sidewall insulating layers each other or more to form holes between the sidewall insulating layers. The vias are provided in the holes respectively.

19 Claims, 26 Drawing Sheets

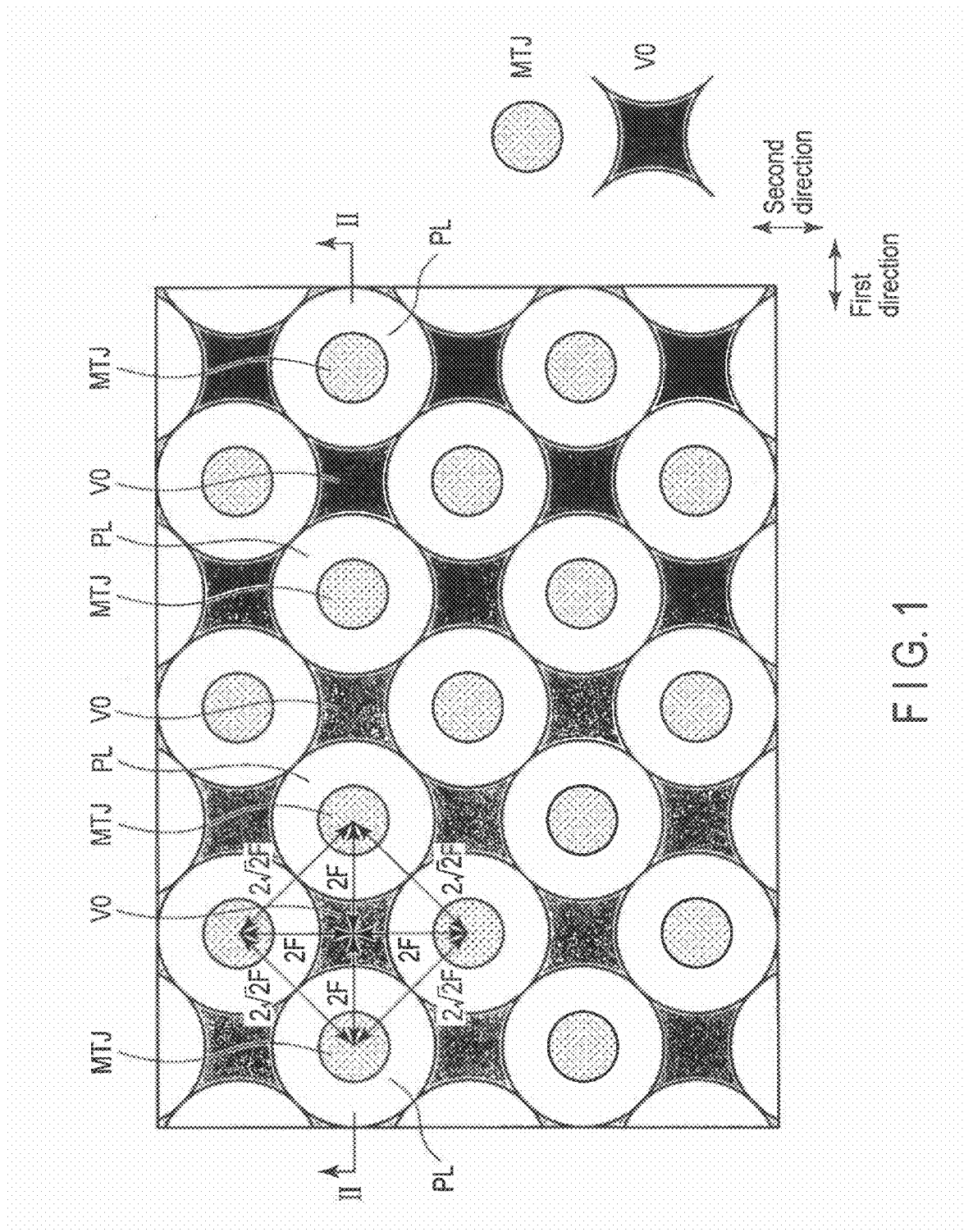
F I G. 1

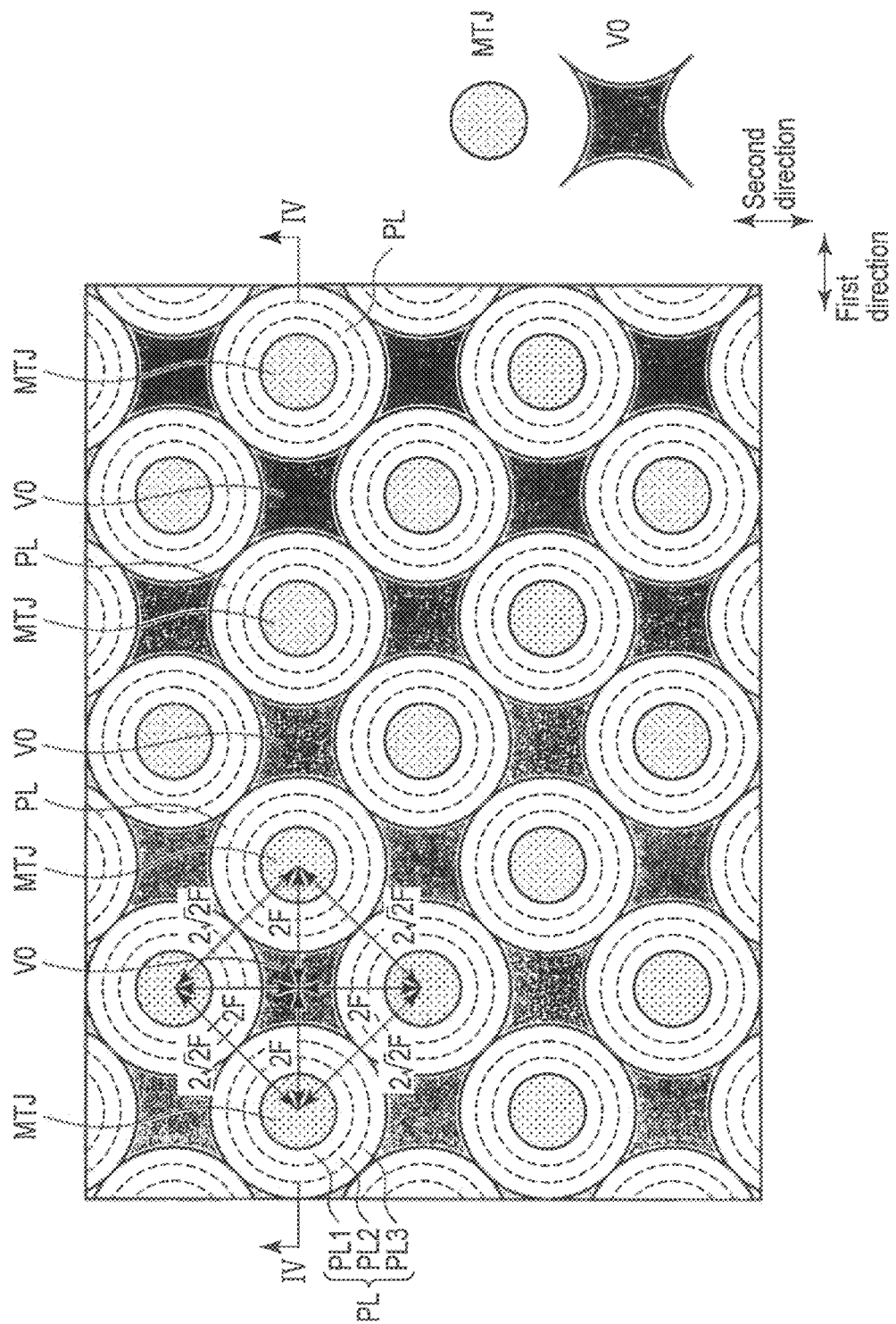
F I G. 3

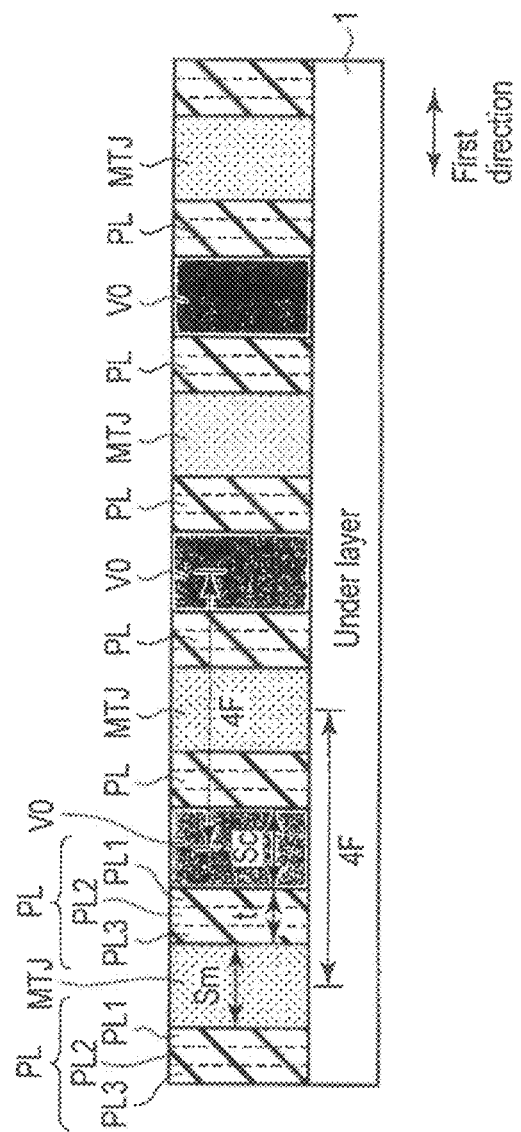
F I G. 4

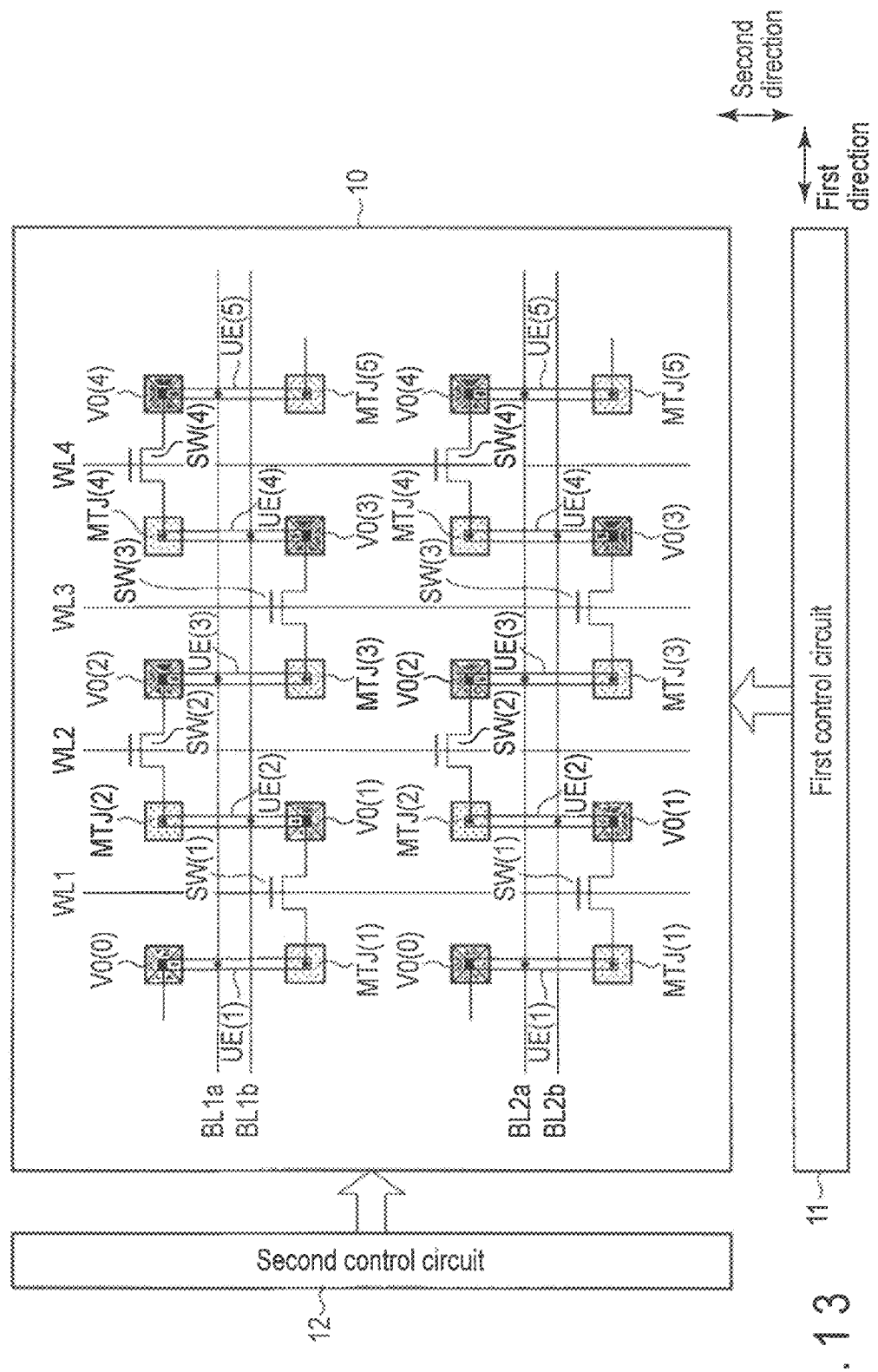
F I G. 13

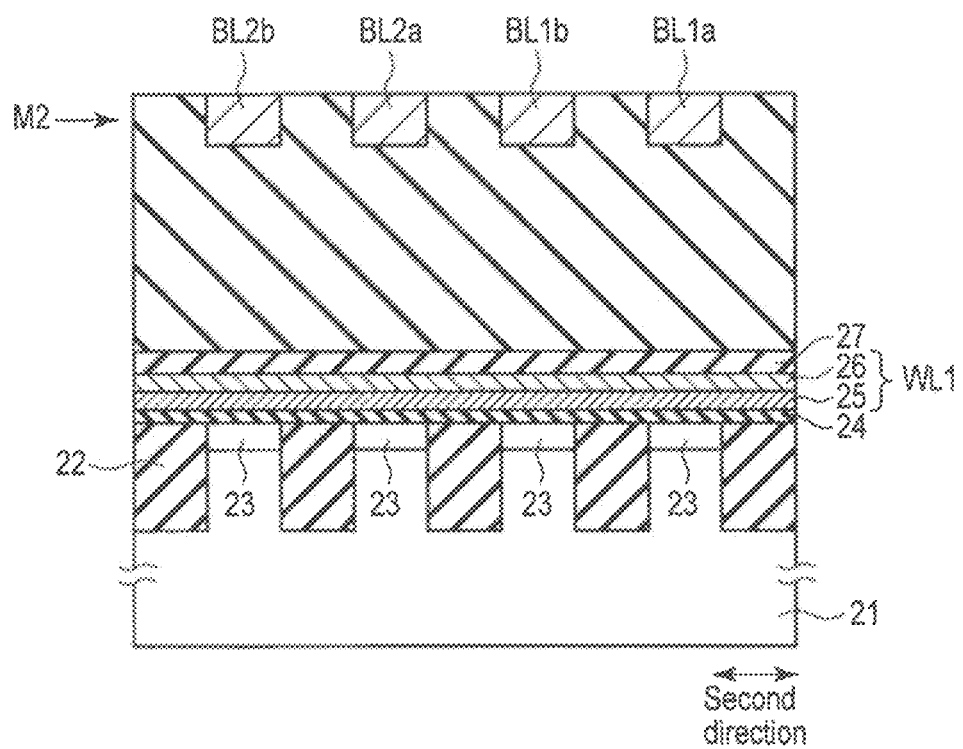
F I G. 18

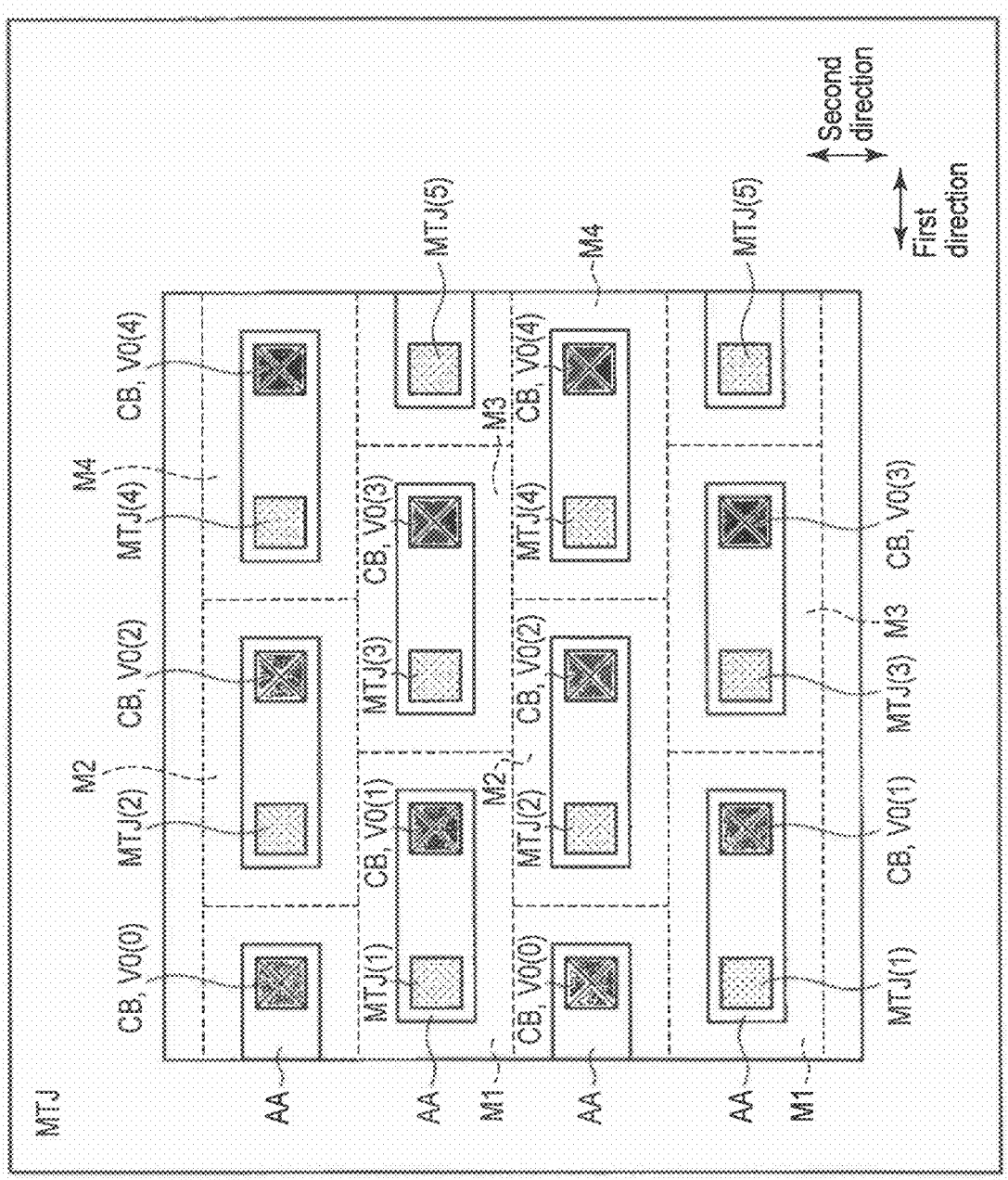
F I G. 21

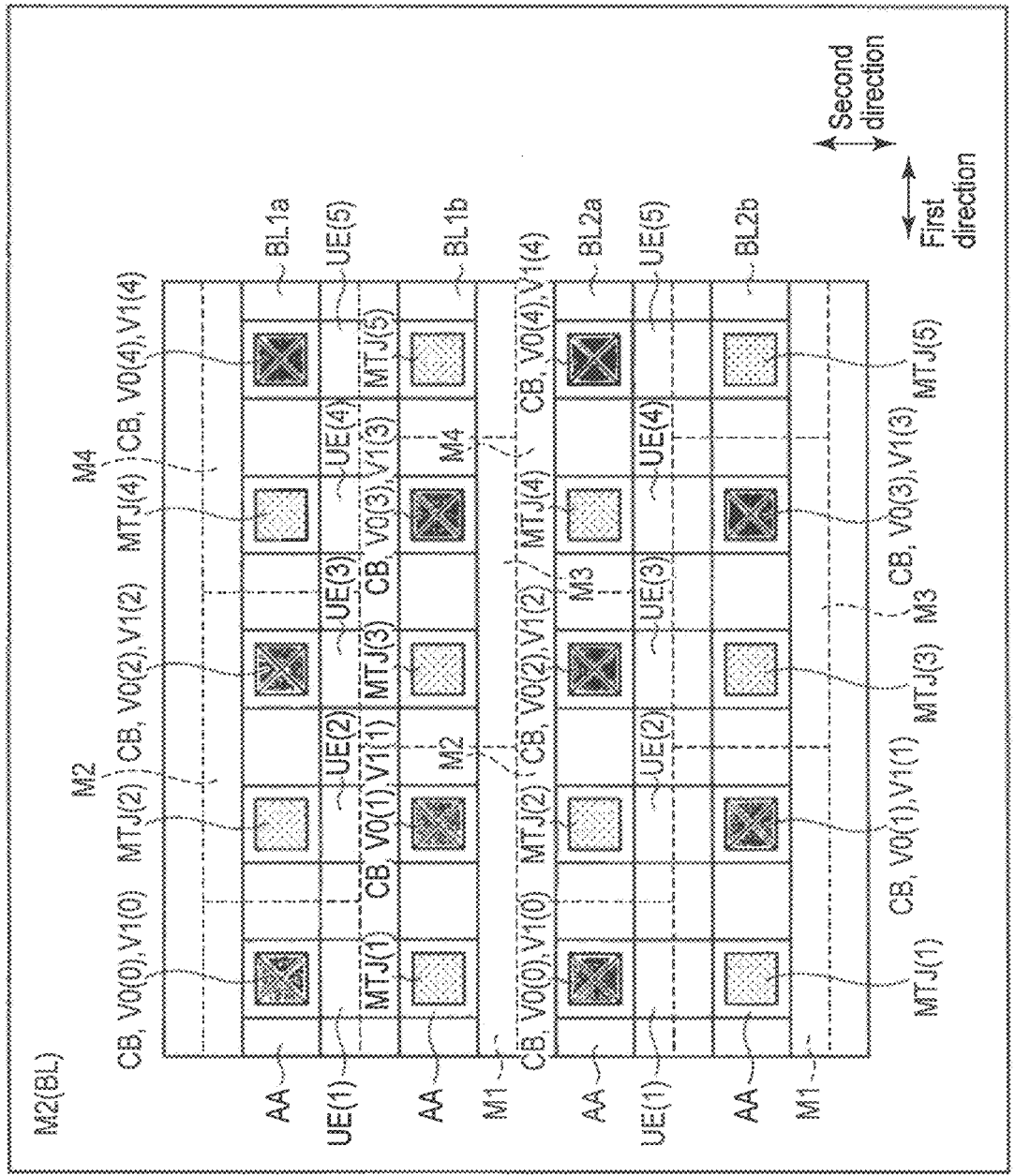
F I G. 23

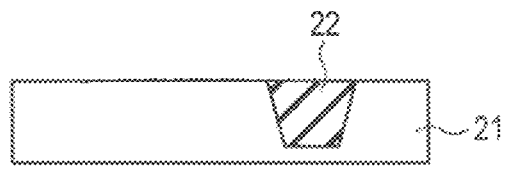
F I G. 2 4
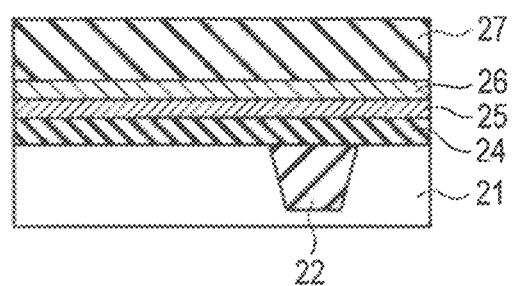
F I G. 2 5
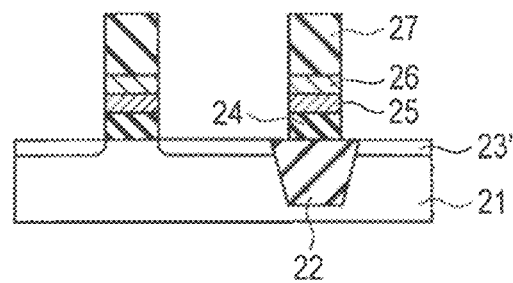
F I G. 2 6

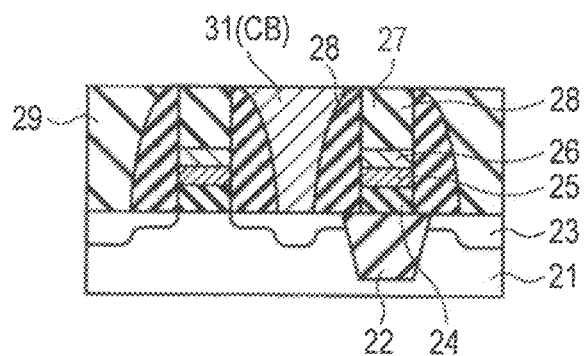
F I G. 30
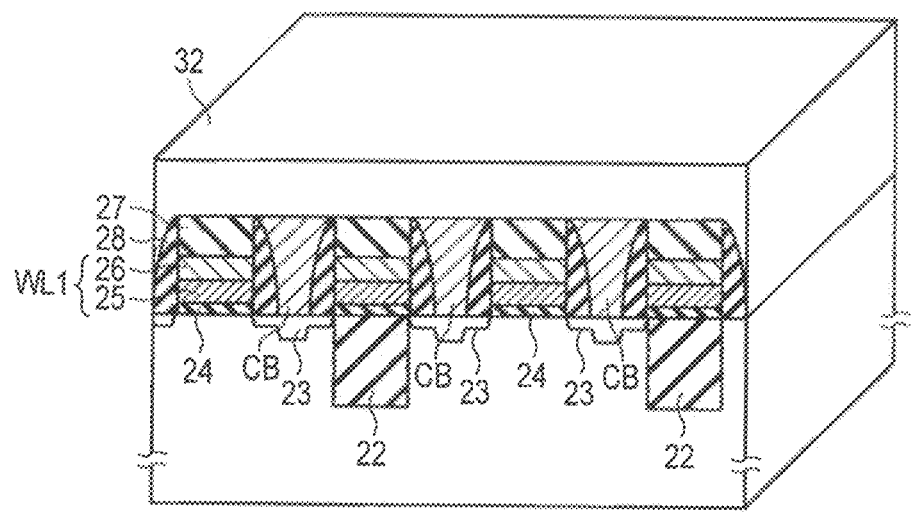
F I G. 31

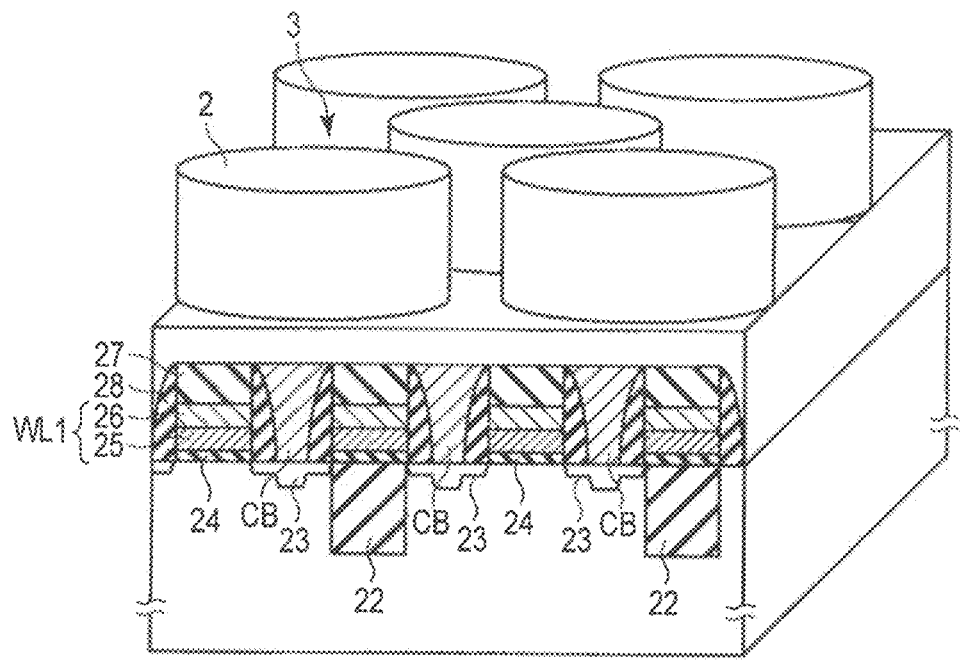
F I G. 3 4
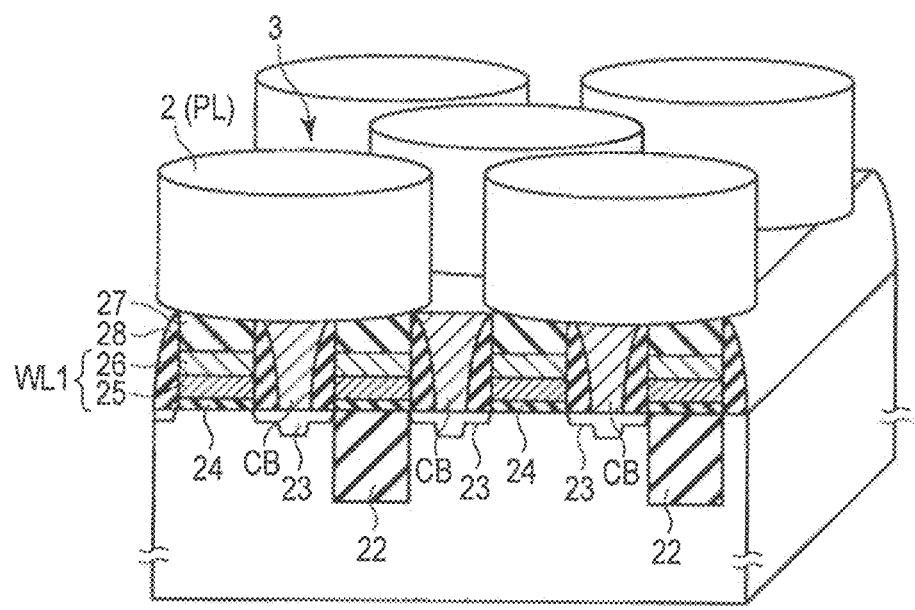
F I G. 3 5

US 8,779,410 B2

RESISTANCE CHANGE MEMORY AND METHOD OF MANUFACTURING THE SAME

CROSS-REFERENCE TO RELATED APPLICATIONS

This application is based upon and claims the benefit of priority from prior Japanese Patent Application No. 2011-144646, filed Jun. 29, 2011, the entire contents of which are incorporated herein by reference.

FIELD

Embodiments described herein relate generally to a resistance change memory and a method of manufacturing the same.

BACKGROUND

In a resistance change memory in which resistance change elements whose resistance values change with a current, voltage, heat, magnetic field and the like are used as memory cells, the development of a process technology which suppresses the number of photo engraving process (PEP) steps as much as possible is essential for lowering a manufacturing cost. However, in a layout in which the resistance change elements and vias are provided in the same layer, both the resistance change elements and the vias need to be independently processed, respectively, and hence it is difficult to decrease the number of the PEP steps.

BRIEF DESCRIPTION OF THE DRAWINGS

FIG. 1 is a plan view showing a first basic structure;
FIG. 3 is a plan view showing a second basic structure;
FIG. 4 is a sectional view along IV-IV line of FIG. 3;
FIG. 13 is a circuit diagram showing a memory cell array as an application example;
FIG. 18 is a sectional view along XVIII-XVIII line of FIG. 15;
FIG. 21 is a plan view showing resistance change elements and vias in the array of FIG. 13;
FIG. 23 is a plan view showing bit lines in the array of FIG. 13;
and
FIG. 24 to FIG. 41 are sectional views showing a manufacturing method of the array of FIG. 14.

DETAILED DESCRIPTION

In general, according to one embodiment, a resistance change memory comprising resistance change elements, vias and sidewall insulating layers, the elements and the vias provided alternately in a first direction and a second direction orthogonal to the first direction, and the sidewall insulating layers provided on sidewalls of the elements, wherein the elements are provided in a lattice pattern having a constant pitch, a thickness of each of the sidewall insulating layers in a direction orthogonal to the sidewalls is a value for contacting the sidewall insulating layers each other or more to form holes between the sidewall insulating layers, and the vias are provided in the holes respectively.

1. BASIC STRUCTURE

With regard to a manufacturing process of a resistance change memory, there has been suggested a process technology which can form vias to be provided in self-alignment in the same layer as that including resistance change elements, without using PEP, to decrease the number of PEP steps.

Here, the resistance change elements are memory cells whose resistance values change with a current, voltage, heat, magnetic field, or the like. Moreover, the resistance change memory is a semiconductor memory which uses the resistance change elements as the memory cells, and examples of the resistance change memory include a magnetic random access memory (MRAM) which uses a magnetoresistive element as a memory cell, a resistive random access memory (ReRAM) which uses a metal oxide element as a memory cell, and a phase change memory (PCRAM) which uses GeSbTe as a memory cell.

Figure 2:
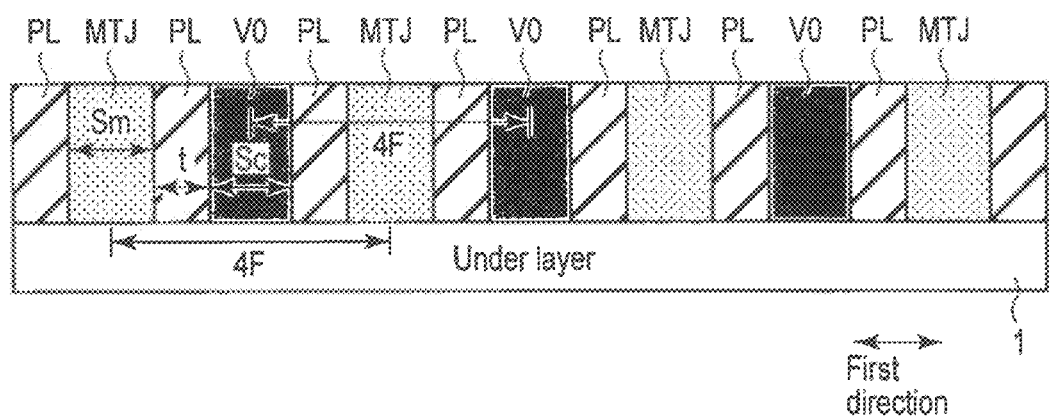
FIG. 2 is a sectional view along II-II line of FIG. 1.

FIG. 1 shows a first basic structure of the resistance change memory. FIG. 2 is a sectional view cut along the II-II line of FIG. 1.

This basic structure relates to resistance change elements MTJ and vias V0 provided in the same layer. In accordance with this structure, there is determined a layout of the other constituent elements of the resistance change memory, for example, switch elements (FETs: field effect transistors), word lines, bit lines, and the like.

It is to be noted that the layout of the memory cell array including the switch elements, the word lines and the bit lines can variously be modified, and hence only resistance change elements MTJ and vias V0 of this basic structure will be described.

An example of the layout of the memory cell array of the resistance change memory will be described later.

Resistance change elements MTJ and vias V0 are provided alternately in a first direction and a second direction orthogonal to this direction.

For example, when F is a reference value, resistance change elements MTJ are laid out at a pitch of 4 F in the first and second directions, respectively. Similarly, vias V0 are also laid out in the pitch of 4 F in the first and second directions, respectively.

F is a reference value for determining the layout of an LSI at a time of designing, and is not an especially determined value; the value refers to, for example, a minimum dimension (a future size or a half pitch of line & space) processable by photolithography.

Sidewall insulating layers PL are provided on sidewalls of resistance change elements MTJ. Sidewall insulating layers PL function as protection layers which protect resistance change elements MTJ.

Moreover, sidewall insulating layers PL are substantially uniformly formed around resistance change elements MTJ.

In consequence, resistance change elements MTJ are provided in a lattice pattern having a constant pitch (e.g., $2\times\sqrt{2}\times F$), and a thickness of each of sidewall insulating layers PL in a direction orthogonal to the sidewalls is set to a value such that all the sidewall insulating layers PL are in contact with each other or more. Then, holes can be formed in self-alignment between sidewall insulating layers PL.

Therefore, when the vias are formed in the holes, the PEP for forming the holes can be omitted.

There will be investigated the layout of resistance change elements MTJ in the lattice pattern having the pitch of $2 \times \sqrt{2} \times F$ as shown in FIG. 1 and FIG. 2.

Thickness t of each of sidewall insulating layers PL in the direction orthogonal to the sidewalls is set to:

$$t \geq (\sqrt{2} \times F) - Sm/2,$$

where Sm is a size of each of resistance change elements MTJ (e.g., a diameter of a round shape). When sidewall insulating layers PL contact each other, the holes can be formed in self-alignment between sidewall insulating layers PL.

Size Sc of each of holes (vias V0) in the first and second directions becomes:

$$Sc = 4F - Sm - 2t.$$

Here, if size Sm of each of resistance change elements MTJ is F, $t \geq \{((2 \times \sqrt{2}) - 1) \times F\}/2$.

If $t = \{((2 \times \sqrt{2}) - 1) \times F\}/2$, $Sc = 2 \times (2 - \sqrt{2}) \times F$.

As described above, according to the above-mentioned basic structure, the number of the PEP steps can be decreased by the sidewall insulating layers provided on the sidewalls of the resistance change memory (a self-alignment contact technology).

Meanwhile, as the self-alignment contact technology, there is known a plug forming technology by providing the sidewall insulating layers on the sidewalls of FET gate electrodes. However, this technology is the self-alignment technology for FET channels, and plugs themselves need to be patterned by PEP.

On the other hand, the above basic structure includes constituent elements for providing resistance change elements MTJ in the lattice pattern having the constant pitch and setting the thickness of each of sidewall insulating layers PL in the direction orthogonal to the sidewalls to the value such that all the sidewall insulating layers PL are in contact with each other or more.

In consequence, the holes (not slits) are formed between sidewall insulating layers PL, and hence the vias (the plugs) themselves can be formed by, for example, an etching back process without using the PEP.

Therefore, the above basic structure is not obtained by simply using the well-known self-alignment contact technology.

It is to be noted that the upper electrodes which connect resistance change elements MTJ and vias V0 need to be processed by PEP. Therefore, as an application example of the above basic structure, for example, it is possible to omit the etching back process and to process vias V0 provided between resistance change elements MTJ and the upper electrodes by one PEP step.

Description thereof will be made later.

FIG. 3 shows a second basic structure of the resistance change memory. FIG. 4 is a sectional view cut along the IV-IV line of FIG. 3.

As compared with the first basic structure, this basic structure is characterized in that sidewall insulating layers PL have a laminate structure including layers. The other characteristics are the same as those of the first basic structure, and hence detailed description thereof is omitted here.

In the present example, each of sidewall insulating layers PL includes first layer PL1 comprising a first material, second layer PL2 comprising a second material, and third layer PL3 comprising a third material.

In the present example, each of sidewall insulating layers PL includes three layers, but the embodiment is not limited to this example. Each of sidewall insulating layers PL may include two or more layers. Moreover, the materials constituting the respective layers may be the same or different. The different materials include the same material having different composition ratios. Moreover, two layers adjacent to each other are made of different materials.

The respective layers in sidewall insulating layers PL are selected from, for example, a group of silicon nitride, boron nitride, aluminium nitride, silicon oxide, aluminium oxide, magnesium oxide, hafnium oxide, lanthanum oxide, zirconium oxide and yttrium oxide.

For example, in the present example, first layer PL1 can use silicon nitride, second layer PL2 can use silicon oxide, and third layer PL3 can use silicon oxide.

It is to be noted that a layer which contacts with one of resistance change elements MTJ preferably comprises a material excellent in a function of protecting resistance change element MTJ, for example, a material excellent in a function of preventing an oxidation of resistance change element MTJ. Moreover, the other layers preferably comprise a material having a low dielectric constant to lower a parasitic capacitance.

Figure 5:
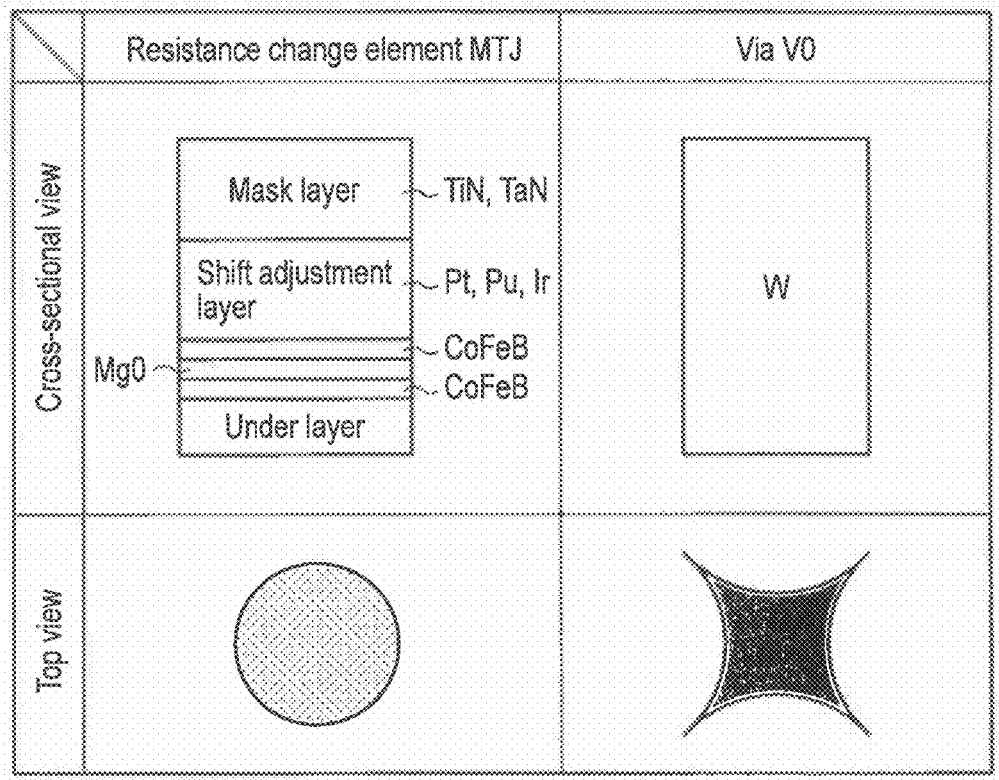
FIG. 5 is a diagram showing an example of a resistance change element and a via.

FIG. 5 shows an example of resistance change element MTJ and via V0.

Resistance change element MTJ is, for example, a magnetoresistive element or a magnetic tunnel junction (MTJ) element.

In this case, the magnetoresistive element includes an under layer, a magnetoresistive layer (CoFeB/MgO/CoFeB) on the under layer, a shift adjustment layer (Pt, Pd, Ir, etc.) on the magnetoresistive layer, and a mask layer (TiN, TaN, etc.) on the shift adjustment layer.

The shift adjustment layer has a function of adjusting a shift of a magnetic hysteresis curve of a magnetic free layer due to the structure of the magnetoresistive layer. When the shift adjustment layer is added to a magnetic pinned layer, the layer exerts a function thereof.

Vias V0 are selected from, for example, a group of tungsten, tungsten nitride, titanium, titanium nitride, copper, tantalum and tantalum nitride.

In the present example, a top view (a planar shape) of each of resistance change elements MTJ has a round shape, and a top view (a planar shape) of each of vias V0 has a star shape, but the embodiment is not limited to this example. Both the top views of resistance change element MTJ and via V0 may have a shape close to a quadrangular shape or an elliptic shape.

As described above, according to the first and second basic structures, it is possible to decrease the number of the PEP steps and lower a manufacturing cost in the manufacturing process of the resistance change memory.

2. MANUFACTURING METHOD

A manufacturing method of the resistance change memory will be described.

In the present example, a method of manufacturing the above-mentioned first basic structure will be described.

Figure 6:
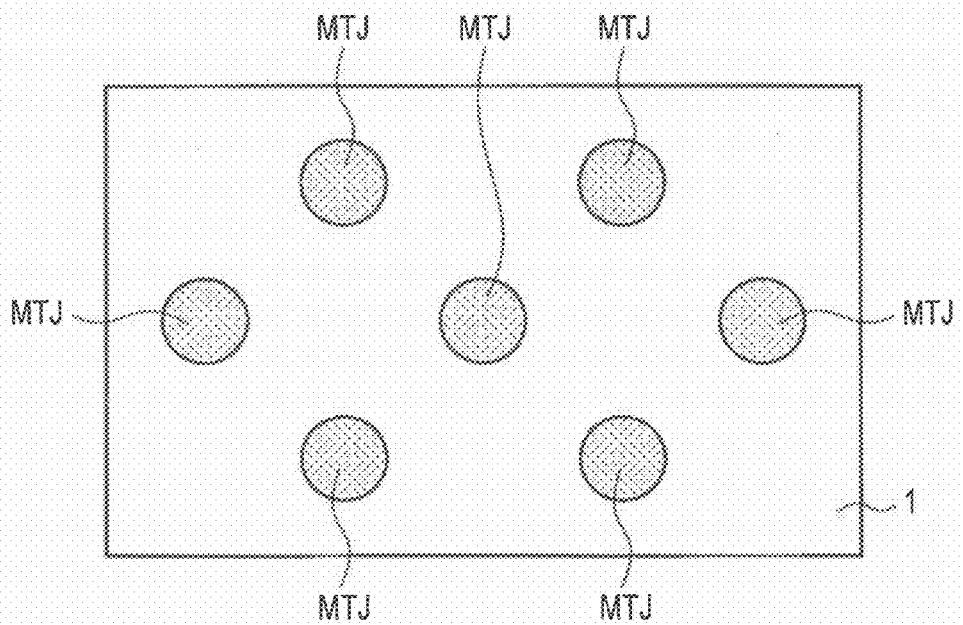
FIG. 6 to FIG. 12 are plan views showing a manufacturing method of the first basic structure.
Figure 7:
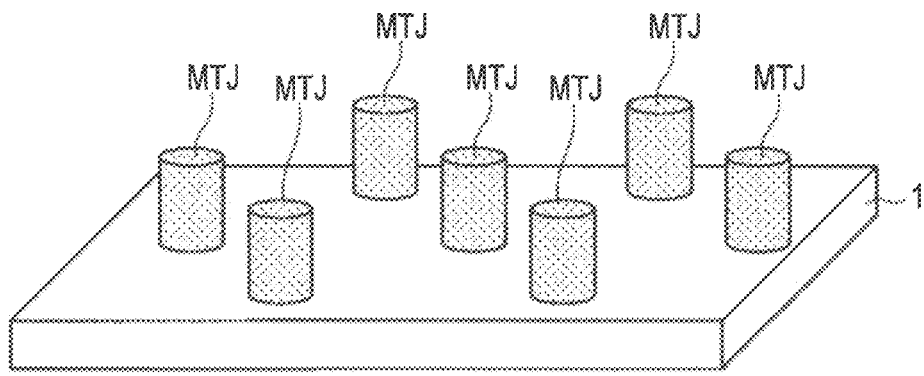

First, an array of resistance change elements MTJ is formed on under layer 1 as shown in FIG. 6 and FIG. 7. This array can be formed by forming, for example, an original laminate structure of resistance change elements MTJ on the under layer and then processing this laminate structure into a pillar shape by ion beam etching or reactive ion etching (RIE).

Here, the array of resistance change elements MTJ is laid out, for example, in a lattice pattern having a pitch of $2 \times \sqrt{2} \times F$.

Figure 8:
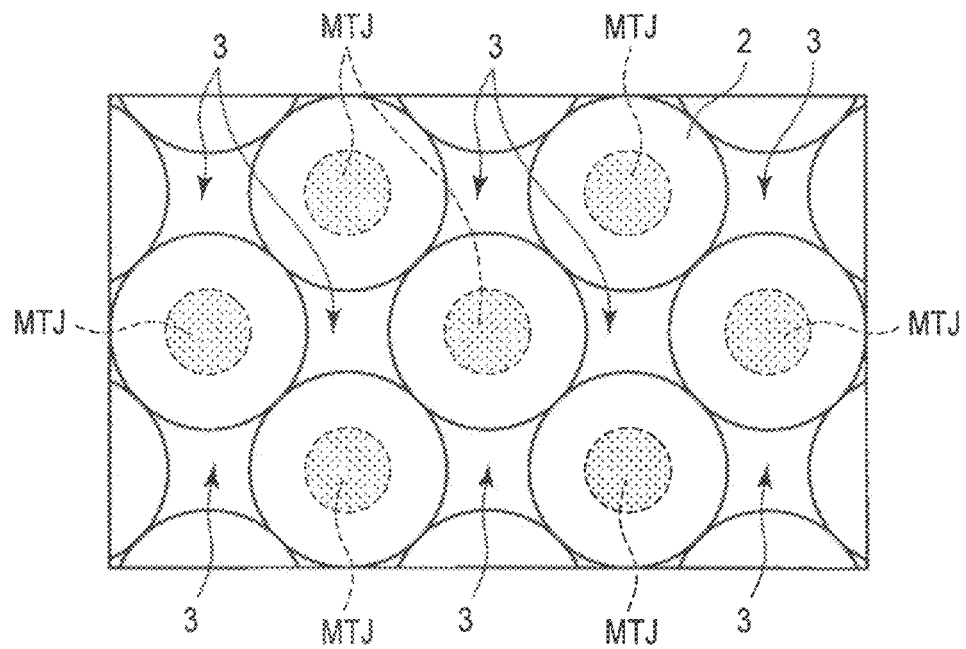
Figure 9:
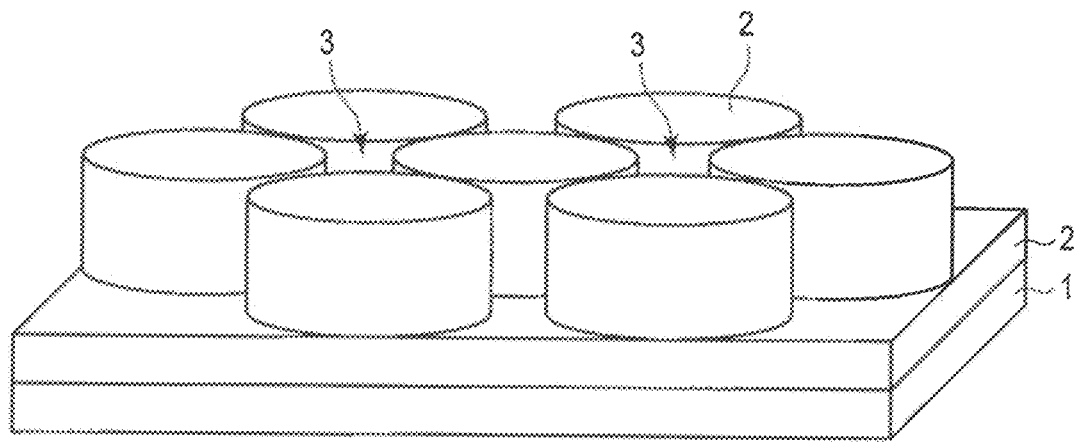

Next, protection layer 2 covering resistance change elements MTJ is formed as shown in FIG. 8 and FIG. 9. Protection layer 2 can be formed by a chemical vapor deposition (CVD) method, a physical vapor deposition (PVD) method, an atomic layer deposition (ALD) method of laminating atoms layer by layer, or the like.

In particular, the ALD method is excellent in coverage, and hence the method is a very desirable deposition method for forming protection layer 2 of the present example.

The protection layer 2 is made of, for example, silicon nitride, silicon oxide, aluminium oxide, magnesium oxide, hafnium oxide, lanthanum oxide, zirconium oxide, yttrium oxide, or the like.

Protection layer 2 is grown to such an extent that protection layers 2 contact each other in a direction orthogonal to the sidewalls of resistance change elements MTJ. This is because if protection layers 2 are not contacted each other, the vias short-circuit each other in a via embedding process described later. Moreover, when protection layers 2 are formed, holes 3 are formed in the self-alignment between resistance change elements MTJ.

Thickness (deposition amount) t of protection layer 2 is set to, for example, $(((2 \times \sqrt{2})-1) \times F)/2$ as described above. In addition, the planar shape of resistance change elements MTJ is a round shape, and a size (the diameter) thereof is L.

Figure 10:
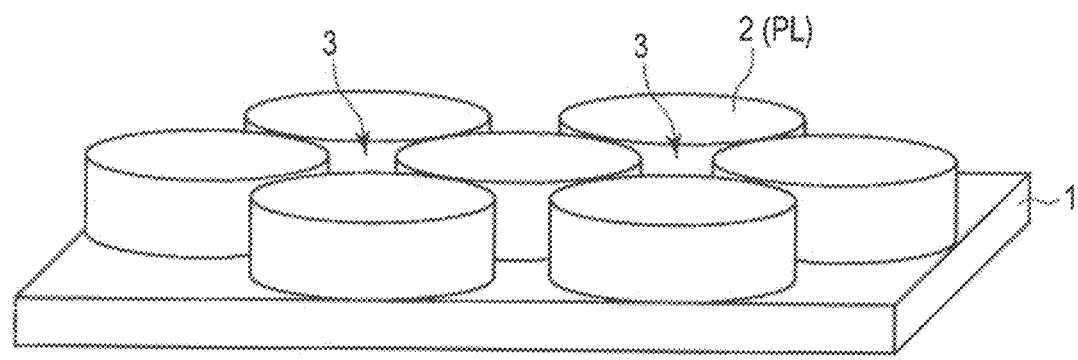

Next, as shown in FIG. 10, protection layer 2 is etched back to expose the upper surface of under layer 1. At this time, the upper surfaces of resistance change elements MTJ may not be exposed from protection layer 2 as shown in the same view, and instead, the upper surfaces thereof may be exposed from protection layer 2.

Upon the completion of this etching back process, protection layer 2 becomes sidewall insulating layers PL provided on the sidewalls of resistance change elements MTJ.

Figure 11:
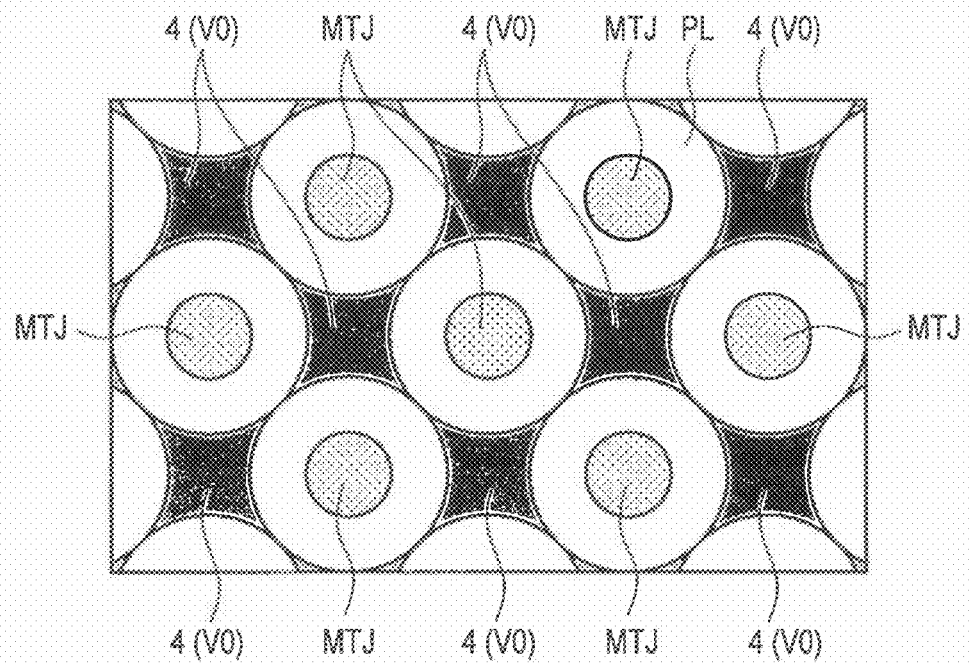
Figure 12:
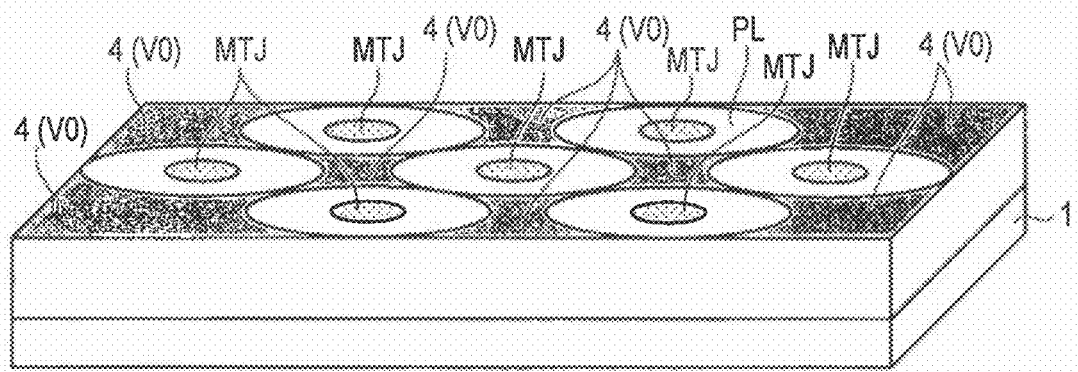

Next, conductive layer 4 which fills the holes ("3" of FIG. 10) is formed as shown in FIG. 11 and FIG. 12. Conductive layer 4 can be formed by the ALD method, the CVD method, the PVD method, or the like. Conductive layer 4 is made of a metal material such as tungsten, titanium, titanium nitride, copper, tantalum or tantalum nitride.

Afterward, the upper surface of conductive layer 4 is cut to form vias V0 by a chemical mechanical polishing (CMP) method or an ion beam etching method. At this time, when the upper surfaces of resistance change elements MTJ are not exposed from sidewall insulating layers PL in the step of FIG. 10, the upper surfaces of sidewall insulating layers PL are simultaneously cut.

In consequence, resistance change elements MTJ whose upper surfaces are exposed from sidewall insulating layers PL are formed. Moreover, vias V0 are formed in self-alignment without using PEP.

3. APPLICATION EXAMPLE

There will be described a resistance change memory to which the above first or second basic structure is applied.

FIG. 13 shows a memory cell array of the resistance change memory.

Memory cell array 10 includes resistance change elements MTJ(1) to MTJ(5), vias V0(0) to V0(4) and FETs SW(1) to SW(4).

Resistance change elements MTJ(1) to MTJ(5) and vias V0(0) to V0(4) are provided alternately in a first direction and a second direction orthogonal to this direction.

Moreover, when only resistance change elements MTJ(1) to MTJ(5) are seen, resistance change elements MTJ(1) to MTJ(5) are provided in the lattice pattern having a constant pitch. Similarly, when only vias V0(0) to V0(4) are seen, vias V0(0) to V0(4) are provided in the lattice pattern having the constant pitch.

FETs SW(1) to SW(4) are provided in the lattice pattern in the same manner as in resistance change elements MTJ(1) to MTJ(5) and vias V0(0) to V0(4). One of the FETs is connected between one of the resistance change elements and one of the vias adjacent to each other in the first direction.

For example, FET SW(1) is connected between resistance change element MTJ(1) and via V0(1) adjacent to each other in the first direction among resistance change elements MTJ(1) to MTJ(5) and vias V0(0) to V0(4). Moreover, FET SW(2) is connected between resistance change element MTJ(2) and via V0(2) adjacent to each other in the first direction among resistance change elements MTJ(1) to MTJ(5) and vias V0(0) to V0(4).

Word lines WL1, WL2, WL3, WL4 and the like extend to the second direction, and are connected in common to gates of the FETs arranged in the second direction.

For example, word line WL1 is connected to the gate of FET SW(1), and word line WL2 is connected to the gate of FET SW(2).

Each of upper electrodes UE(1) to UE(5) is connected between one of the resistance change elements and one of the vias adjacent to each other in the second direction.

For example, upper electrode UE(1) is connected to via V0(0) and resistance change element MTJ(1). Moreover, upper electrode UE(2) is connected to via V0(1) and resistance change element MTJ(2). Furthermore, upper electrode UE(3) is connected to via V0(2) and resistance change element MTJ(3).

Bit lines BL1a, BL1b, BL2a, BL2b and the like extend to the first direction, and are connected to every other electrode among upper electrodes UE(1) to UE(5) arranged in the first direction.

For example, bit lines BL1a and BL2a are connected to odd-numbered upper electrodes UE(1), UE(3) and UE(5). Moreover, bit lines BL1b and BL2b are connected to even-numbered upper electrodes UE(2) and UE(4).

First control circuit 1 controls potentials of word lines WL1, WL2, WL3, WL4, and the like. Second control circuit 12 controls potentials of bit lines BL1a, BL1b, BL2a, BL2b, and the like.

For example, when performing reading/writing from/into resistance change element MTJ(1), first control circuit 1 sets the potential of word line WL1 to "H", and sets potentials of the other word lines WL2, WL3, WL4 and the like to "L". Here, "H" is the potential which turns on the FET, and "L" is the potential which turns off the FET.

At this time, when second control circuit 12 controls the potentials of bit lines BL1a, BL1b, BL2a, BL2b and the like, the reading/writing into/from resistance change element MTJ(1) can be performed.

Figure 14:
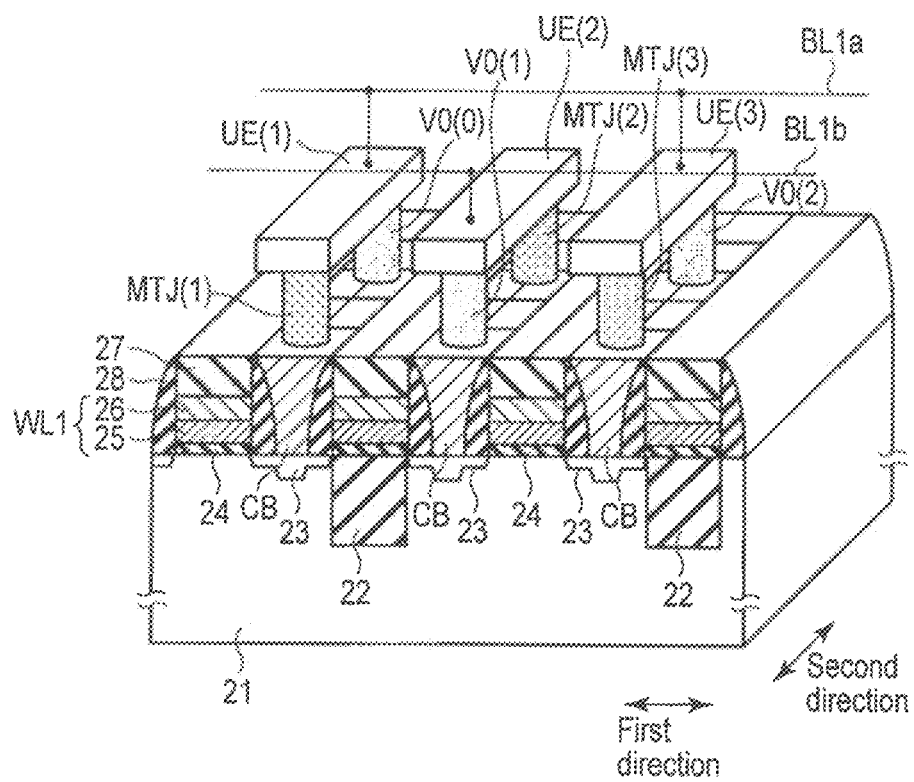
FIG. 14 is a perspective view showing a structure example of the memory cell array of FIG. 13.

FIG. 14 shows an example of a device structure of the memory cell array of FIG. 13.

In semiconductor substrate 21, an element isolation layer 22 having a shallow trench isolation (STI) structure is provided. In an active area surrounded by element isolation layer 22, source/drain diffusion layers 23 are arranged.

Moreover, gate insulating layer 24, conductive silicon layer 25, metal layer 26 and mask layer 27 are arranged on a channel area between source/drain diffusion layers 23. Metal layer 26 contains, for example, metal silicide. Single metal layer 26 or metal layers may be provided. Mask layer 27 is, for example, an insulating layer.

Conductive silicon layer 25 and metal layer 26 function as FET gates. Moreover, the layers extend to the second direction to function also as word lines WL1, WL2, WL3, WL4 and the like. On sidewalls of gate insulating layer 24, conductive silicon layer 25, metal layer 26 and mask layer 27, sidewall insulating layer 28 is provided to contact with source/drain diffusion layers 23 in self-alignment.

On source/drain diffusion layers 23, contact vias (plugs) CB are arranged. On contact vias CB, resistance change elements MTJ(1), MTJ(2), MTJ(3) and the like and vias V0(0), V0(1), V0(2) and the like are arranged. On resistance change elements MTJ(1), MTJ(2), MTJ(3) and the like and vias V0(0), V0(1), V0(2) and the like, upper electrodes UE(1), UE(2), UE(3) and the like are arranged.

Figure 15:
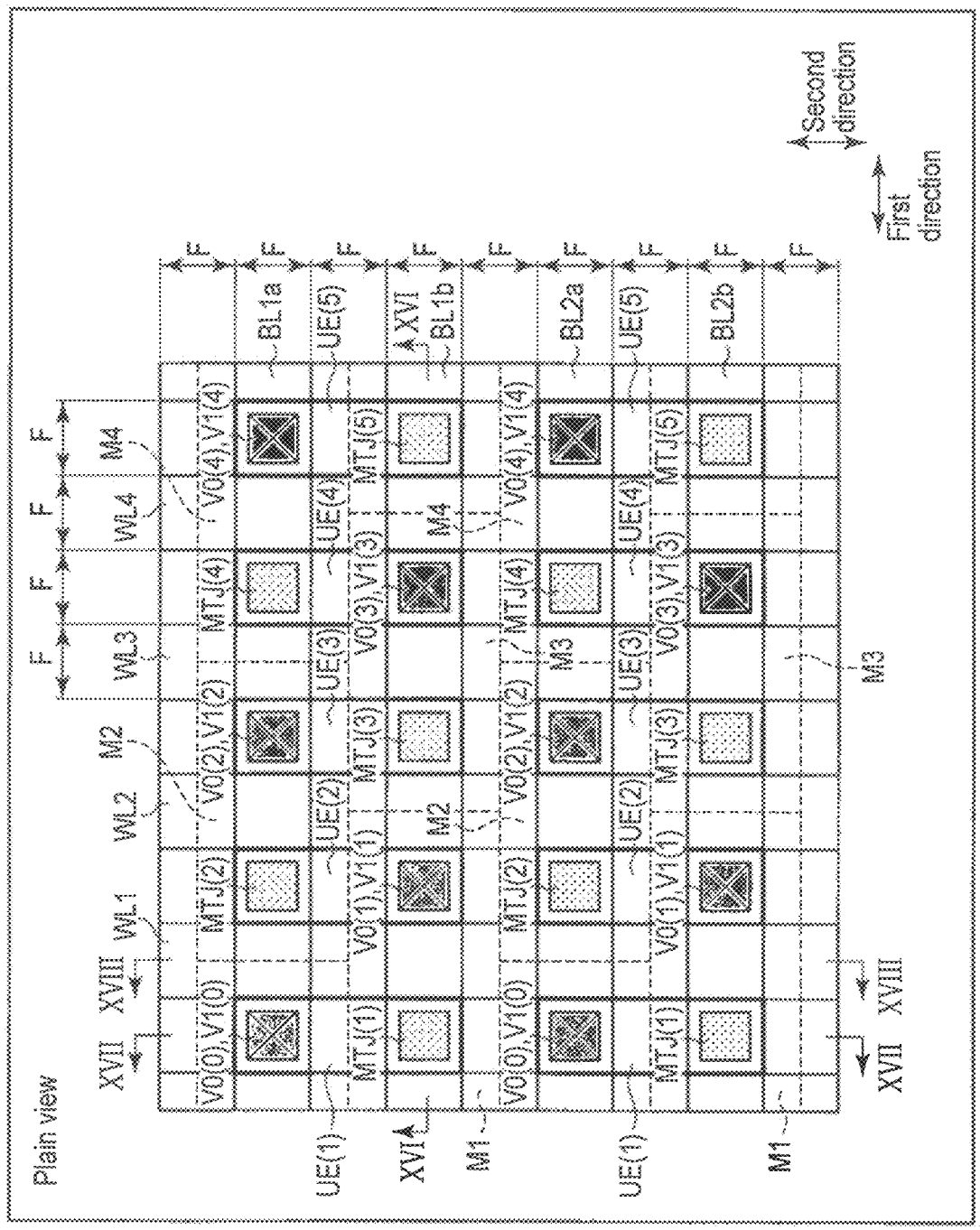
FIG. 15 is a plan view showing a structure example of the array of FIG. 13.
Figure 16:
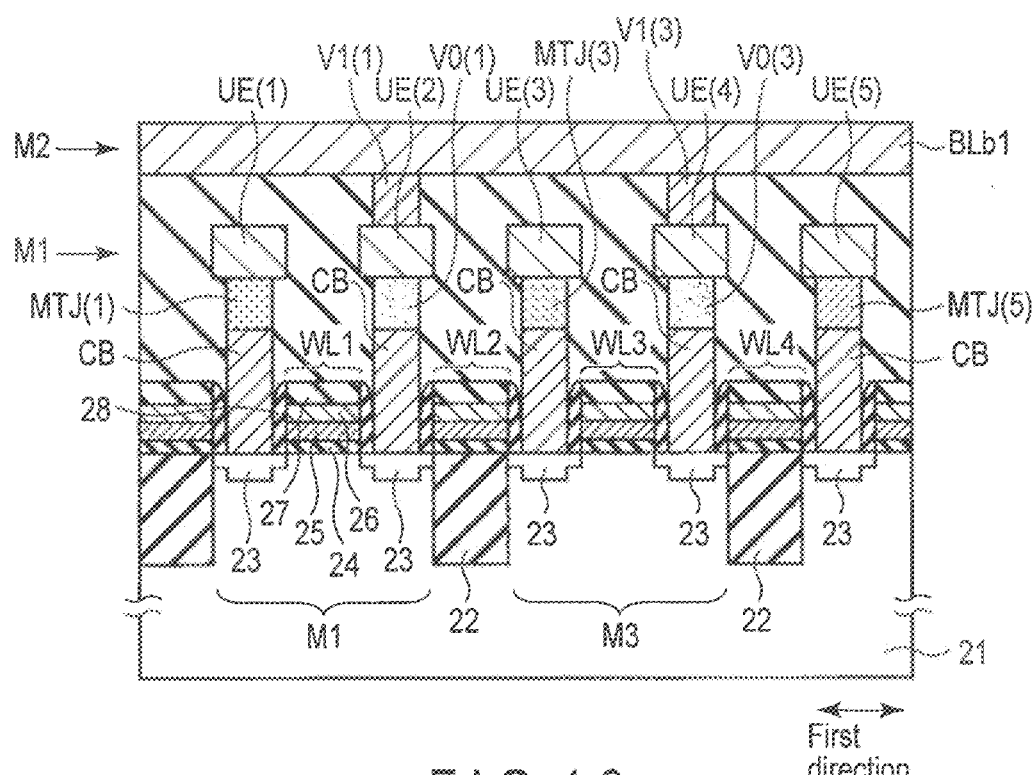
FIG. 16 is a sectional view along XVI-XVI line of FIG. 15.
Figure 17:
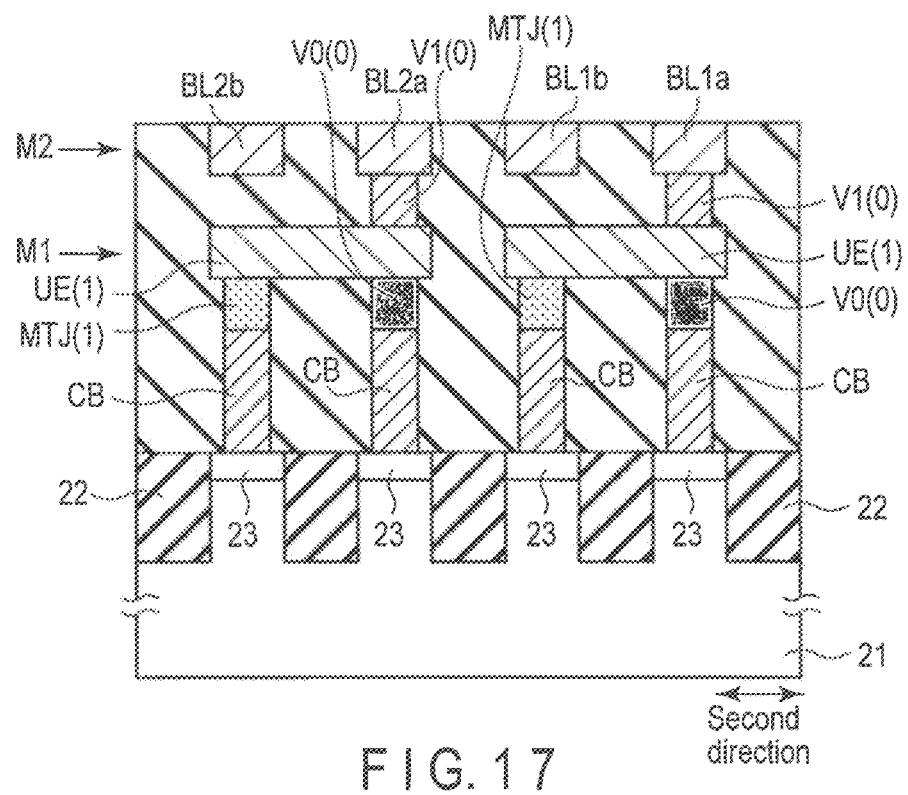
FIG. 17 is a sectional view along XVII-XVII line of FIG. 15.

FIG. 15 is a plan view specifically showing a layout of the memory cell array. FIG. 16 is a sectional view cut along the XVI-XVI line of FIG. 15, FIG. 17 is a sectional view cut along the XVII-XVII line of FIG. 15, and FIG. 18 is a sectional view cut along the XVIII-XVIII line of FIG. 15.

These views correspond to FIG. 13 and FIG. 14, and hence in these views, the same elements as those of FIG. 13 and FIG. 14 are denoted with the same reference marks to omit the detailed description thereof.

F is a reference value. One memory cell is provided in an area surrounded by a broken line. In the present example, memory cells M2 and M4 are arranged along bit lines BL1a and BL2a, and memory cells M1, M3 and M5 are arranged along bit lines BL1b and BL2b.

A planar size of one memory cell is $8 \times F^2$. Resistance change elements MTJ(1) to MTJ(5) are arranged in the lattice pattern having a pitch of $2 \times \sqrt{2} \times F$. Similarly, vias V0(0) to V0(4) are also arranged in the lattice pattern having the pitch of $2 \times \sqrt{2} \times F$.

Word lines WL1 to WL4 are arranged at a pitch of 2×F (half pitch F). Similarly, bit lines BL1a, BL1b, BL2a and BL2b are also arranged at a pitch of 2×F (half pitch F).

Upper electrodes UE(1) to UE(5) are formed in first metal wiring layer M1, and bit lines BL1a, BL1b, BL2a and BL2b are formed in second metal wiring layer M2 on first metal wiring layer M1.

Upper electrodes UE(1) to UE(5) are connected to bit lines BL1a, BL1b, BL2a and BL2b through vias V1(0) to V1(4). It is to be noted that in the plan view of FIG. 15, upper electrodes UE(1) to UE(5) are shown by bold lines.

Figure 19:
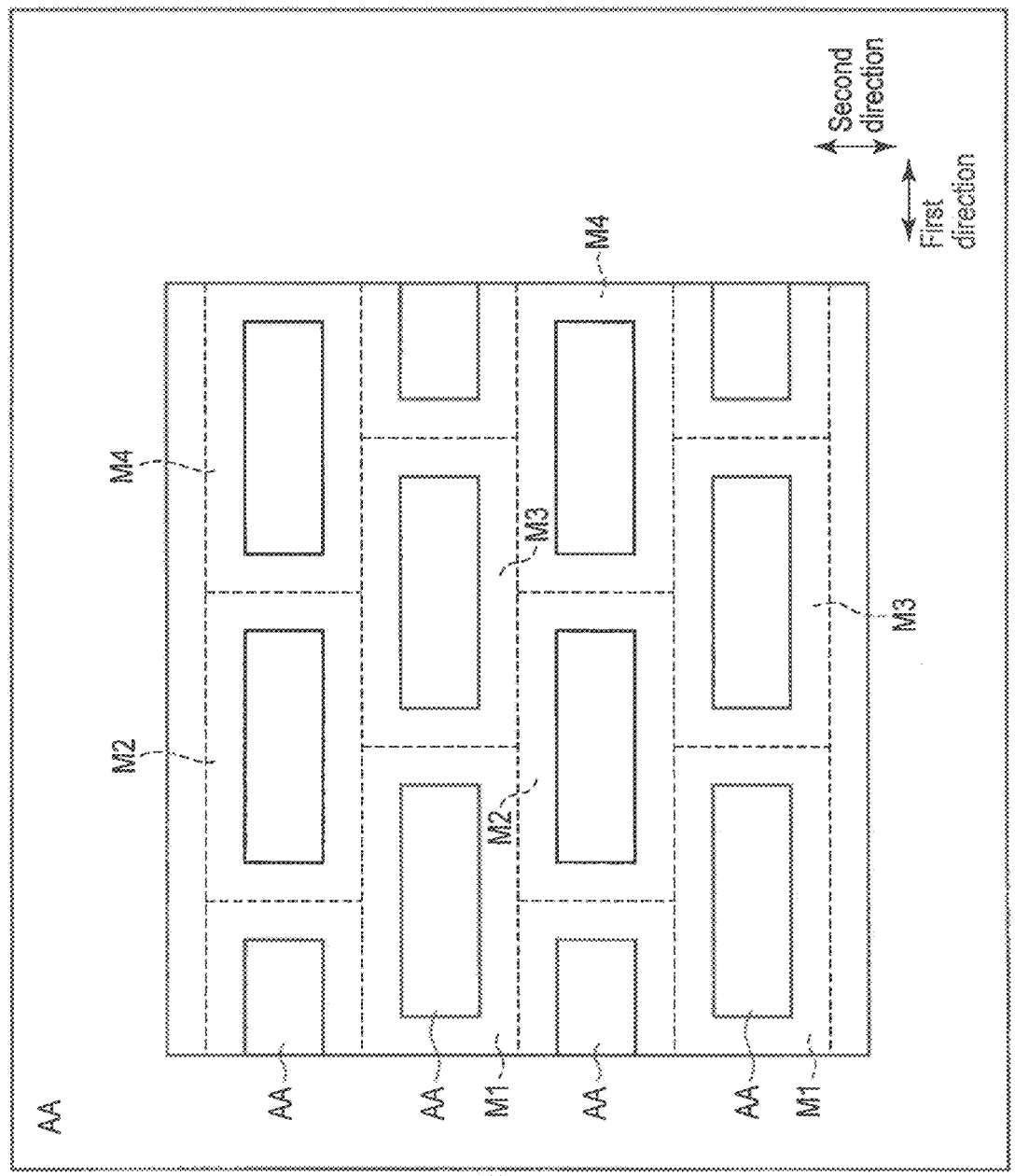
FIG. 19 is a plan view showing an active area in the array of FIG. 13.

FIG. 19 is a view of active areas AA extracted from the plan view of FIG. 15.

Active areas AA are arranged to correspond to memory cells M1 to M4, respectively.

Figure 20:
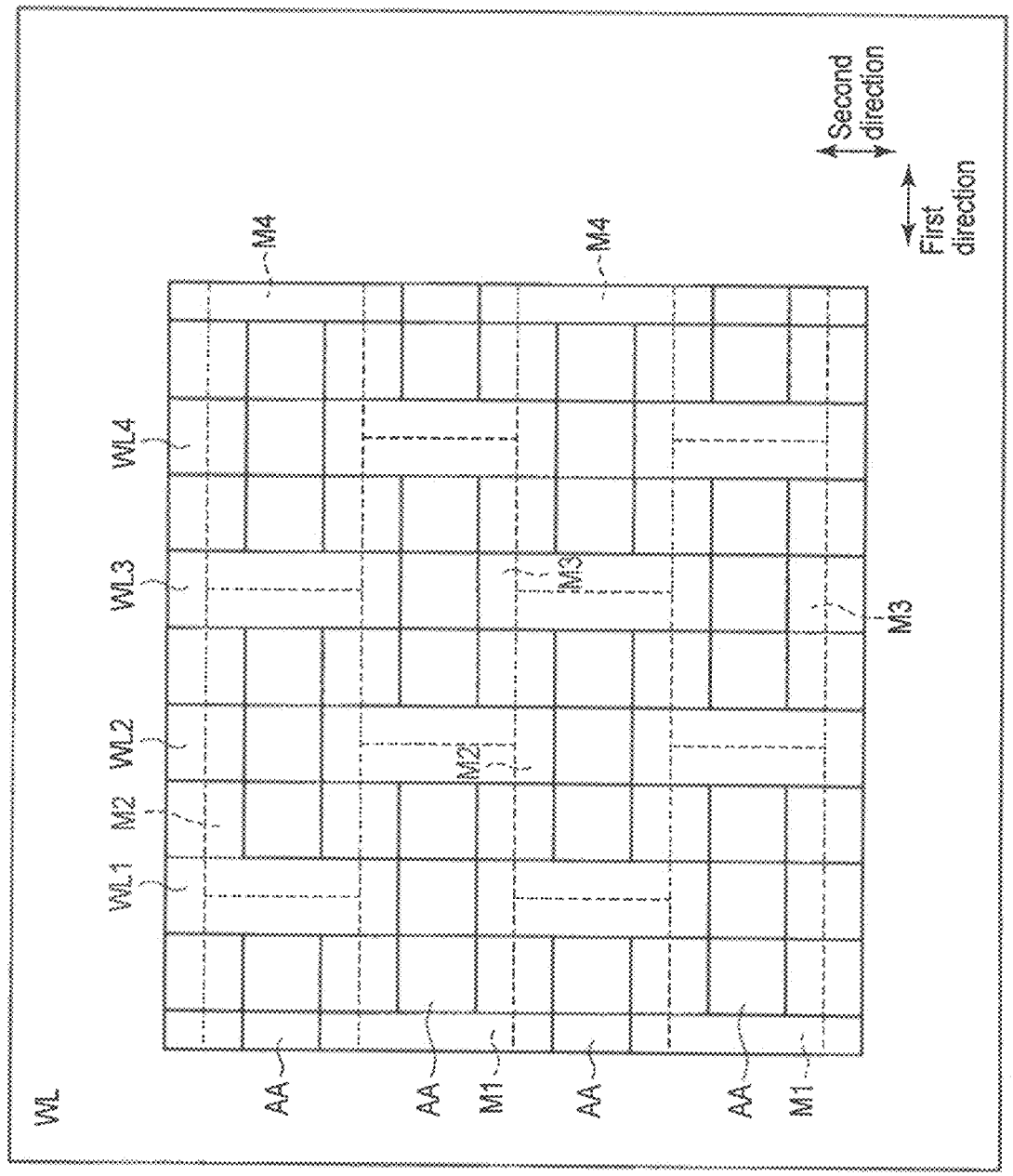
FIG. 20 is a plan view showing word lines in the array of FIG. 13.

FIG. 20 is a view of word lines WL1 to WL4 extracted from the plan view of FIG. 15.

Word lines WL1 to WL4 are arranged at a pitch of 2×F along the first direction, and extend to the second direction. The view shows a layout of word lines WL1 to WL4 superimposed on a layout of active areas AA.

FIG. 21 is a view of resistance change elements MTJ(1) to MTJ(5) and vias V0(0) to V0(4) extracted from the plan view of FIG. 15.

Each of resistance change elements MTJ(1) to MTJ(5) is provided on one end of each of active areas AA in the first direction. Moreover, each of vias V0(0) to V0(4) is provided on the other end of active area AA.

Figure 22:
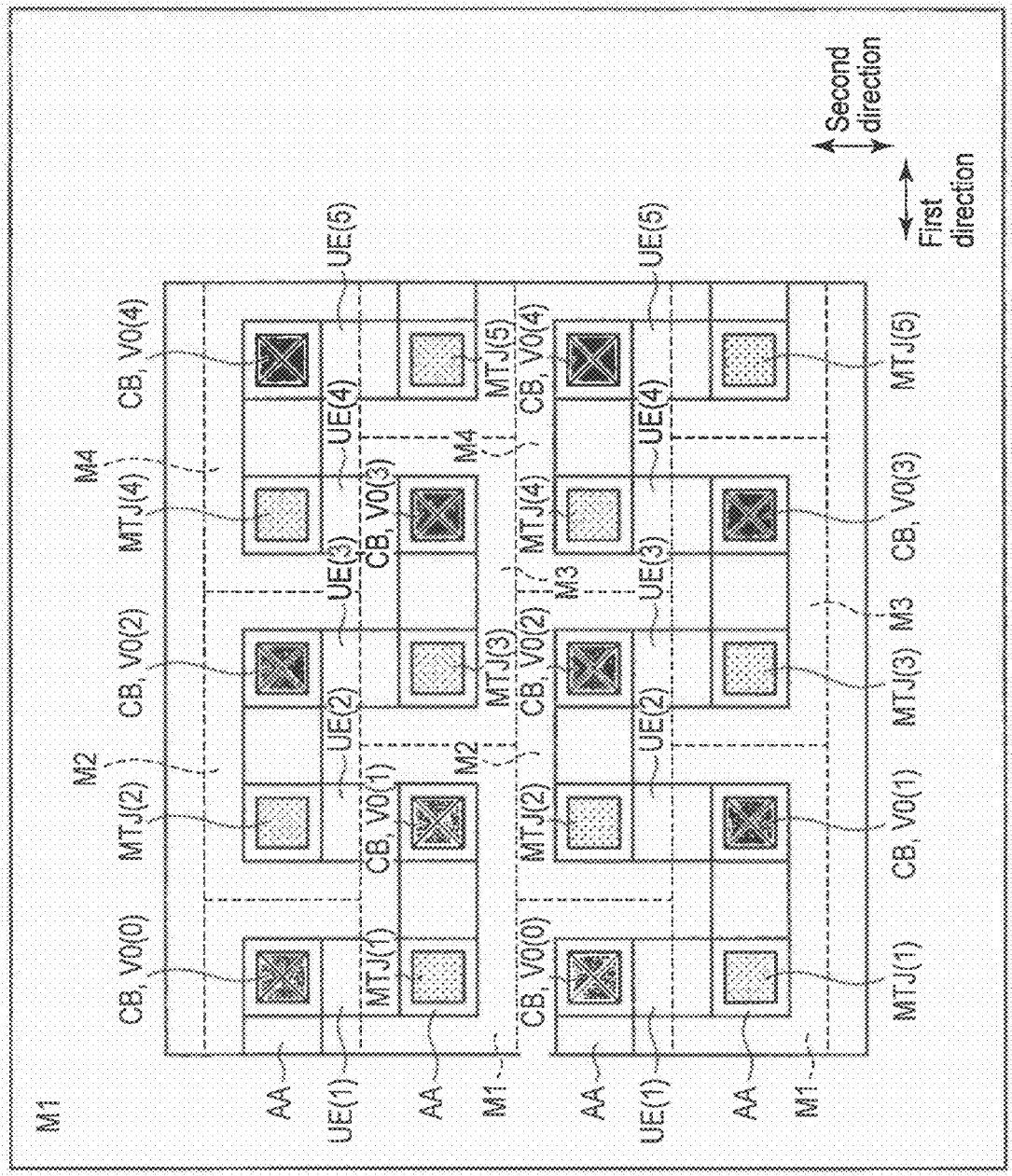
FIG. 22 is a plan view showing upper electrodes in the array of FIG. 13.

FIG. 22 is a view of upper electrodes UE(1) to UE(5) extracted from the plan view of FIG. 15.

Each of upper electrodes UE(1) to UE(5) connects one of the resistance change elements to one of the vias, the resistance change element and the via being adjacent to each other in the second direction. As apparent from the same view, memory cells M1 to M5 are connected in series with each other, and extend to the first direction while meandering.

FIG. 23 is a view of bit lines BL1a, BL1b, BL2a and BL2b extracted from the plan view of FIG. 15.

Bit lines BL1a, BL1b, BL2a and BL2b are arranged at a pitch of 2×F along the second direction, and extend to the first direction. The same view shows bit lines BL1a, BL1b, BL2a and BL2b superimposed on a layout of resistance change elements MTJ(1) to MTJ(5), and the like.

Next, a manufacturing method of the above resistance change memory will be described.

First, as shown in FIG. 24 to FIG. 30, a FET is formed as a selection switch in a surface area of semiconductor substrate 21. The FET is formed by, for example, the following process.

As shown in FIG. 24, element isolation layer 22 having an STI structure is formed in semiconductor substrate 21. Next, as shown in FIG. 25, gate insulating layer 24, conductive silicon layer 25, metal layer 26 and mask layer 27 are successively formed on semiconductor substrate 21.

Next, as shown in FIG. 26, a resist pattern is formed by the photo engraving process (PEP), and mask layer 27 is etched by using this resist pattern. Afterward, the resist pattern is removed. Then, mask layer 27 is used as a mask to etch metal layer 26, conductive silicon layer 25 and gate insulating layer 24 by, for example, the reactive ion etching (RIE), to form a gate electrode of the FET.

Moreover, ion implantation is performed by using this gate electrode as the mask, to form extension diffusion layer 23' in semiconductor substrate 21.

Figure 27:
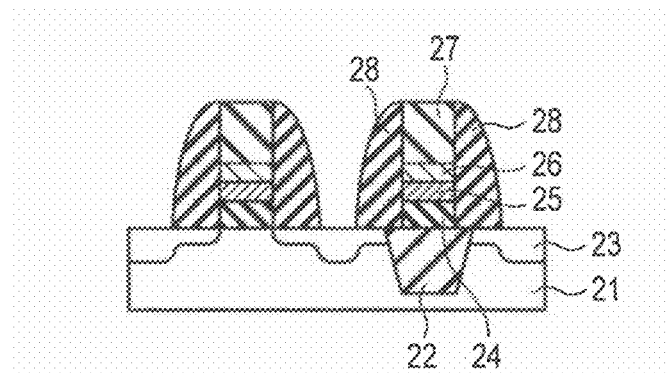

Next, as shown in FIG. 27, an insulating layer covering the gate electrode of the FET is formed, and then this insulating layer is etched by the RIE, to form sidewall insulating layer 28 on the sidewall of the gate electrode. Then, ion implantation is performed in self-alignment by use of the gate electrode and the sidewall insulating layer as the mask, to form source/drain diffusion layer 23 in semiconductor substrate 21.

Figure 28:
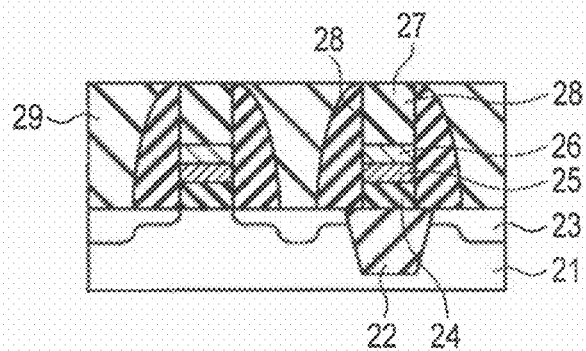

Next, as shown in FIG. 28, interlayer insulating layer 29 is formed by, for example, the chemical vapor deposition (CVD) method, and the upper surface of interlayer insulating layer 29 is flattened by the chemical mechanical polishing (CMP) method. Here, sidewall insulating layer 28 and interlayer insulating layer 29 are preferably made of different materials having an etching selection ratio.

Figure 29:
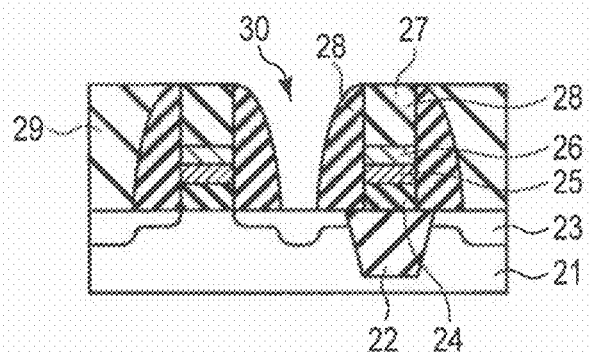

Next, as shown in FIG. 29, a resist pattern is formed by using the PEP, and then the RIE is performed by using this resist pattern as a mask, to form via hole (contact hole) 30 in interlayer insulating layer 29 on source/drain diffusion layer 23. Afterward, the resist pattern is removed.

Next, as shown in FIG. 30, the via hole on source/drain diffusion layer 23 is filled by conductive layer 31. Conductive layer 31 fills the via hole by, for example, the CVD method, and is then flattened by the CMP. In consequence, conductive layer 31 functions as contact via (plug) CB.

The FET as the selection switch is formed by the above process.

Next, as shown in FIG. 31 to FIG. 38, an array of resistance change elements MTJ and vias V0 is formed on contact vias CB. The array of resistance change elements MTJ and vias V0 is formed by the following process.

Figure 32:
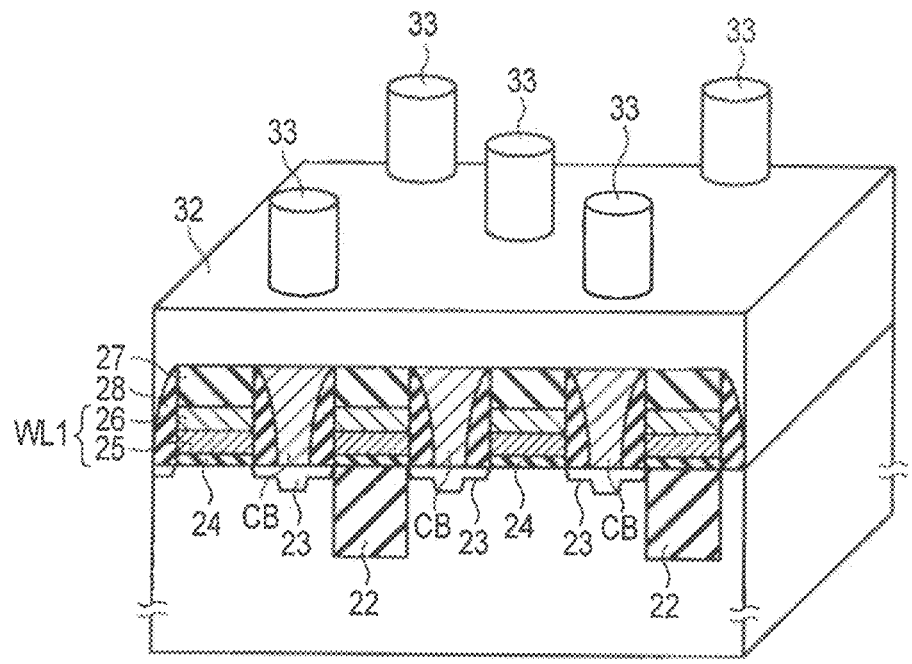

As shown in FIG. 31, for example, original laminate structure 32 of resistance change elements MTJ is formed on contact vias CB. Moreover, as shown in FIG. 32, resist patterns 33 are formed by the PEP, and laminate structure 32 is etched by the ion beam etching or the RIE by use of by resist patterns 33 as masks.

Figure 33:
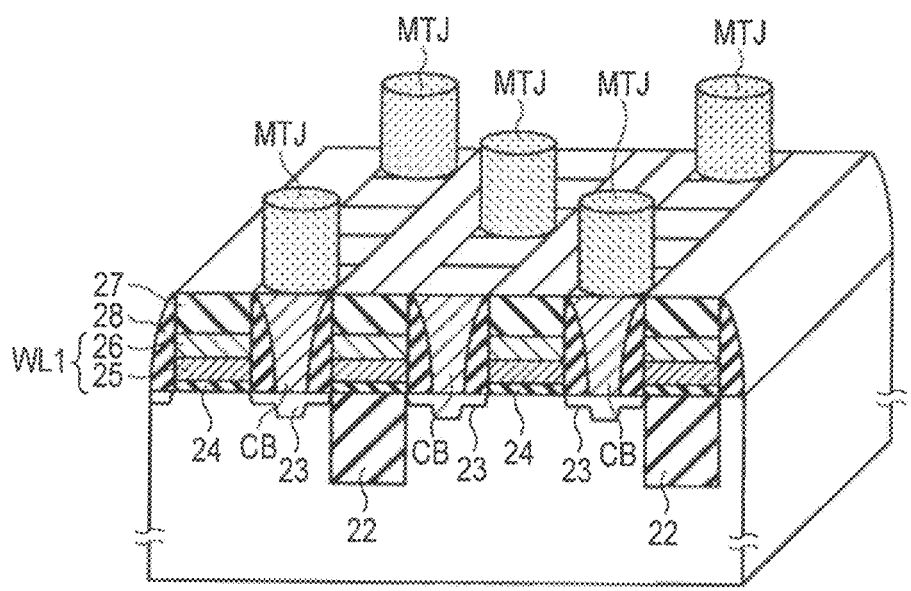

As a consequence, the array of resistance change elements MTJ processed into the pillar shape is formed on contact vias CB as shown in FIG. 33. This array is laid out in, for example, the lattice pattern having the pitch of $2 \times \sqrt{2} \times F$.

Next, as shown in FIG. 34, protection layer 2 covering resistance change elements MTJ is formed. It is possible to form protection layer 2 by the CVD method, the PVD method, the ALD method, or the like. Protection layer 2 is made of, for example, silicon nitride, silicon oxide, aluminium oxide, magnesium oxide, hafnium oxide, lanthanum oxide, zirconium oxide, yttrium oxide, or the like.

Protection layers 2 are grown to such an extent that protection layers 2 contact each other in the direction orthogonal to the sidewalls of resistance change elements MTJ. This is because if protection layers 2 do not contact each other, the vias short-circuit with each other in a via embedding process described later. Moreover, when protection layers 2 are formed, holes 3 are formed in self-alignment between resistance change elements MTJ.

Next, as shown in FIG. 35, protection layers 2 are etched back to expose the upper surfaces of contact vias CB in bottom portions of holes 3. At this time, the upper surfaces of resistance change elements MTJ are not exposed from protection layers 2 as shown in the same view.

Upon the completion of this etching back process, protection layers 2 become sidewall insulating layers PL provided on the sidewalls of resistance change elements MTJ.

Figure 36:
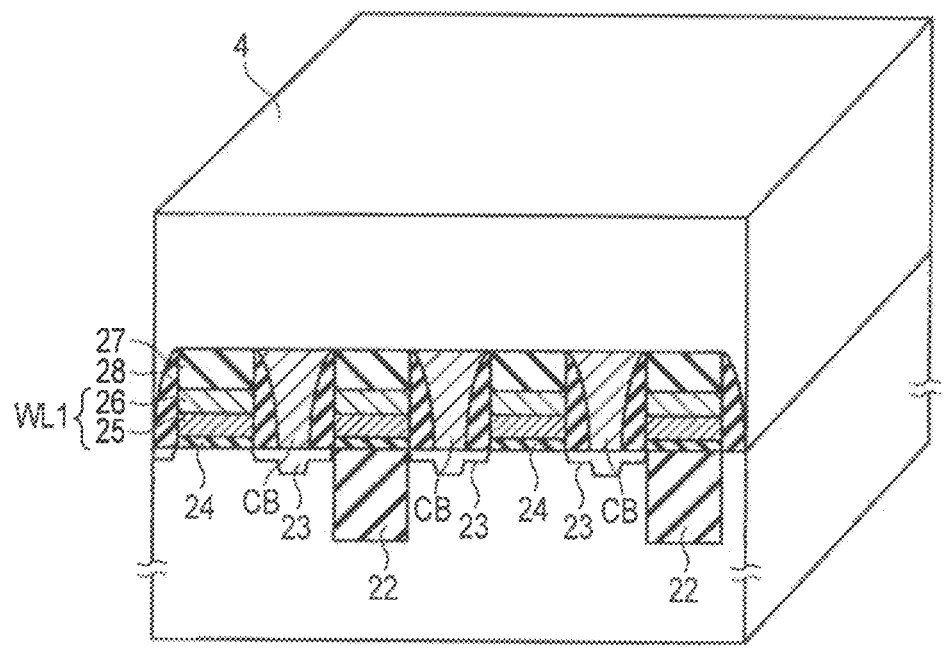

Next, as shown in FIG. 36, conductive layer 4 is formed to fill holes 3 of FIG. 35. It is possible to form conductive layer 4 by the ALD method, the CVD method, the PVD method, or the like. Conductive layer 4 is made of a metal material such as tungsten, tungsten nitride, titanium, titanium nitride, copper, tantalum or tantalum nitride.

Figure 37:
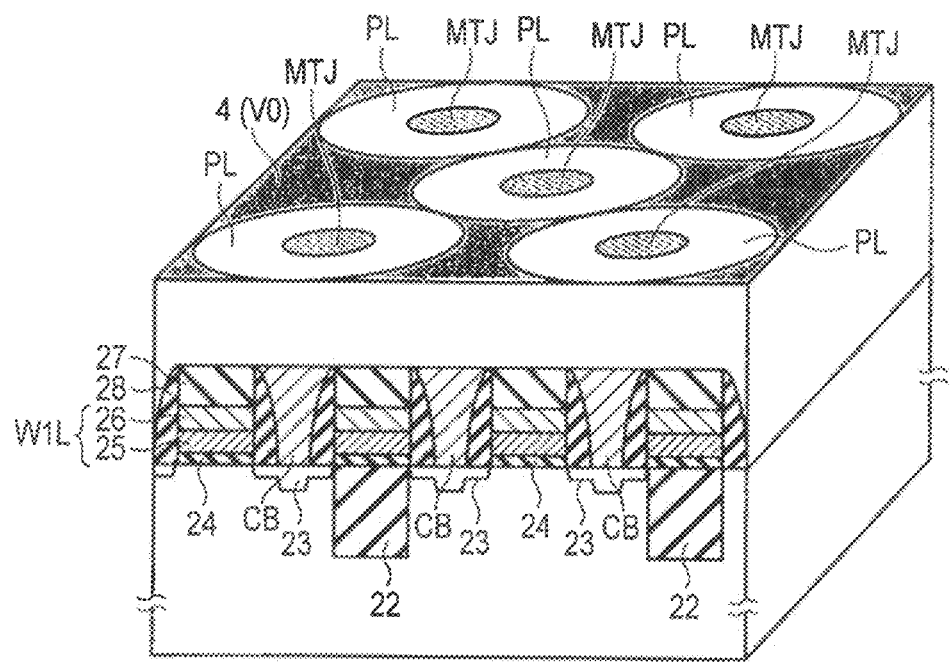

Next, as shown in FIG. 37, the upper surface of conductive layer 4 is cut by, for example, the CMP method, the ion beam etching method, or the RIE method to form vias V0. At this time, the upper surfaces of sidewall insulating layers PL are simultaneously cut, to expose the upper surfaces of resistance change elements MTJ from sidewall insulating layers PL.

In consequence, resistance change elements MTJ whose upper surfaces are exposed from sidewall insulating layers PL are formed. Moreover, vias V0 are formed in the self-alignment without using the PEP.

Figure 38:
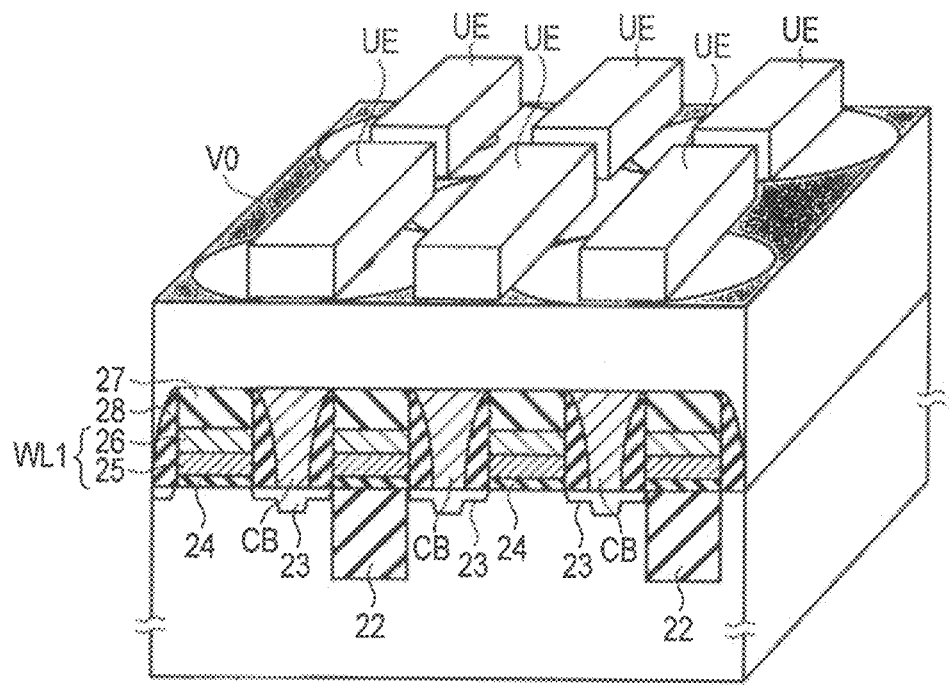

Finally, as shown in FIG. 38, there are formed upper electrodes UE which connect resistance change elements MTJ to vias V0. Upper electrodes UE can be formed, for example, by forming a conductive layer by the CVD method and then patterning this conductive layer by using the PEP and the RIE.

According to the above manufacturing method, the number of PEP steps can be decreased to lower a manufacturing cost. It is to be noted that the manufacturing method can further be simplified by the following process.

Figure 39:
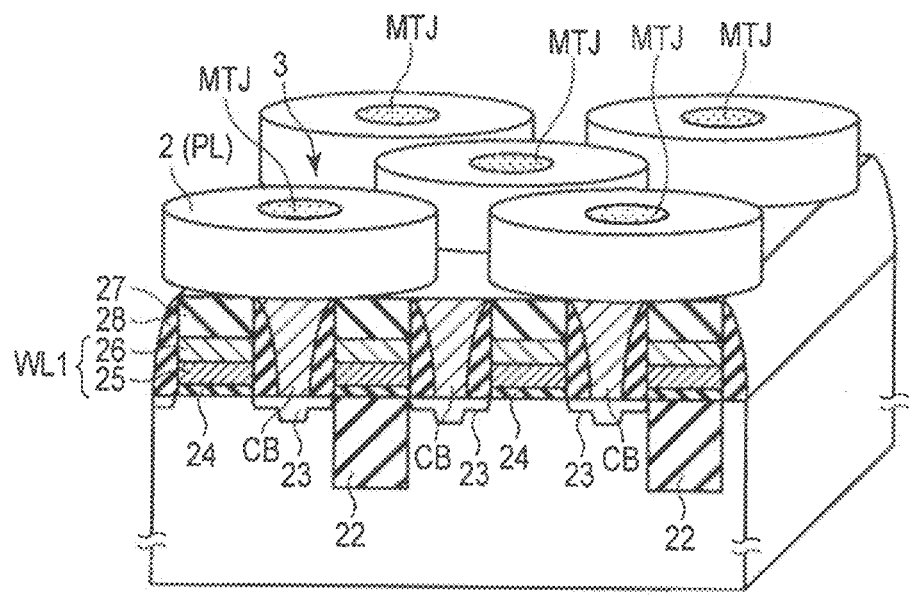
Figure 40:
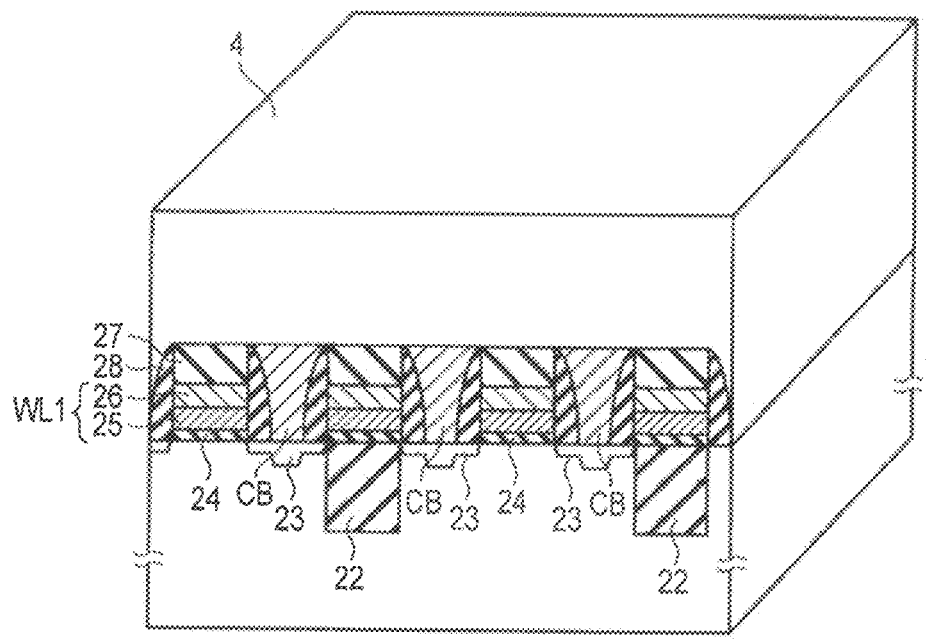
Figure 41:
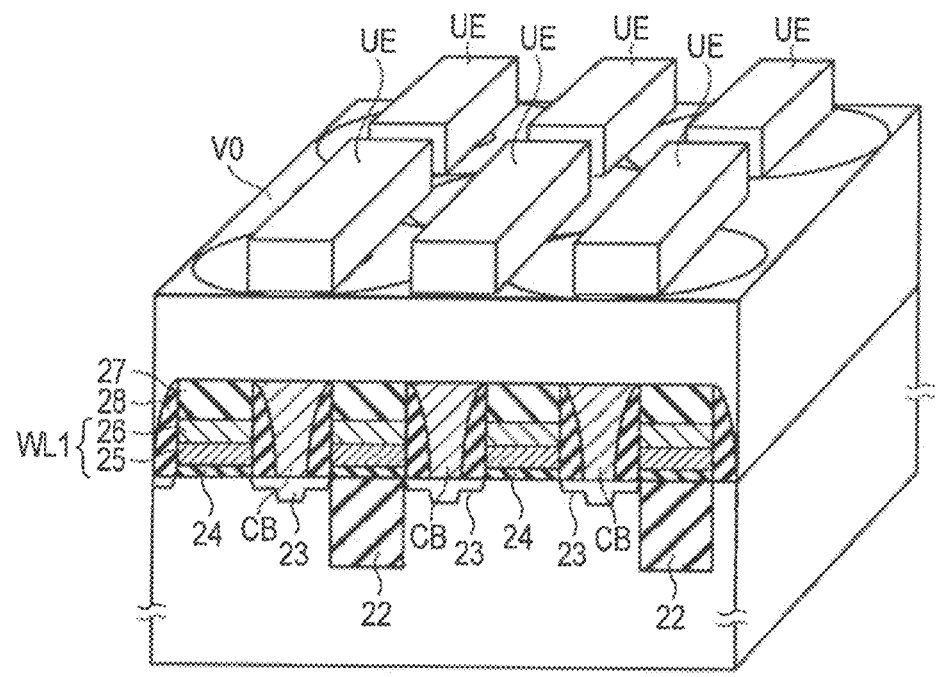

FIG. 39 to FIG. 41 show a modification example of the above manufacturing method of FIG. 24 to FIG. 38.

First, as shown in FIG. 24 to FIG. 34, a process is executed to form protection layer 2 covering resistance change elements MTJ.

Next, as shown in FIG. 39, protection layer 2 is etched back to expose the upper surfaces of contact vias CB in the bottom portions of holes 3. At this time, the upper surfaces of resistance change elements MTJ are exposed from protection layer 2 as shown in the same view.

Upon the completion of this etching back process, protection layer 2 becomes sidewall insulating layers PL provided on the sidewalls of resistance change elements MTJ.

Next, as shown in FIG. 40, conductive layer 4 which fills holes 3 of FIG. 39 is formed. It is possible to form conductive layer 4 by the ALD method, the CVD method, the PVD method, or the like.

Next, as shown in FIG. 41, upper electrodes UE and vias V0 are simultaneously formed. Upper electrodes UE and vias V0 can be formed, for example, by forming a resist pattern by the PEP and then etching conductive layer 4 of FIG. 40 by the RIE by use of this resist pattern as the mask. The structure of FIG. 38 is characterized in that upper electrodes UE and vias V0 are made of the same material. In this case, a parasitic resistance can be small by decreasing a number of boundary faces between different materials.

In consequence, when vias V0 are formed in self-alignment, upper electrodes UE are simultaneously formed on resistance change elements MTJ.

According to the above modification example, the etching back process shown in FIG. 37 can be omitted. In consequence, the manufacturing cost can further be lowered.

4. CONCLUSION

According to the embodiment, it is possible to decrease the number of PEP steps and lower a manufacturing cost in a manufacturing process of a resistance change memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a resistance change memory, the memory comprising resistance change elements, vias and sidewall insulating layers, the elements and the vias provided alternately in a first direction and a second direction orthogonal to the first direction, and the sidewall insulating layers provided on sidewalls of the elements, wherein the elements are provided in a lattice pattern having a constant pitch, a thickness of each of the sidewall insulating layers in a direction orthogonal to the sidewalls has at least a value for contacting the sidewall insulating layers to each other to form holes between the sidewall insulating layers, and the vias are provided in the holes respectively, and each of the resistance change elements is a magnetoresistive element including magnetic layers, the method comprising:
 forming the elements;
 forming an insulating material covering the elements;
 forming the holes in a self-alignment when the sidewall insulating layers is formed by etching back the insulating material; and
 forming the vias in the holes respectively.

2. The method of claim 1,
 wherein the etching back is executed to expose the elements to form upper electrodes at the same time of forming the vias, and each of the upper electrodes is connected to one of the vias and one of the elements.

3. The memory of claim 1,
wherein the vias are selected from a group of tungsten, titanium, titanium nitride, copper, tantalum, and tantalum nitride.

4. The method of claim 1,
wherein the magnetoresistive element comprises an under layer, a magnetoresistive layer on the under layer, a shift adjustment layer on the magnetoresistive layer, and a mask layer on the shift adjustment layer.

5. The method of claim 1,
wherein a planar shape of the magnetoresistive element is a round shape, a quadrangular shape, or an elliptic shape.

6. The method of claim 1,
wherein a planar shape of each of the vias is a star shape, a quadrangular shape, or an elliptic shape.

7. The method of claim 1,
wherein the sidewall insulating layer covers the sidewall of the magnetoresistive element.

8. The method of claim 1,
wherein the sidewall insulating layer is formed by an atomic layer deposition (ALD) method.

9. The method of claim 1,
wherein the vias are provided in a lattice pattern having a constant pitch.

10. The method of claim 1, further comprising an FET is connected between a magnetoresistive element and a via adjacent to each other in the first direction.

11. The method of claim 1, further comprising an upper electrode is connected between a magnetoresistive element and a via adjacent to each other in the second direction.

12. The method of claim 11, further comprising bit lines extending in the first direction,
wherein each of the bit lines is connected alternatively to upper electrodes arranged in the first direction.

13. A resistance change memory comprising:
resistance change elements, vias and sidewall insulating layers, the elements and the vias provided alternately in a first direction and a second direction orthogonal to the first direction, and the sidewall insulating layers provided on sidewalls of the elements, wherein the elements are provided in a lattice pattern having a constant pitch, a thickness of each of the sidewall insulating layers in a direction orthogonal to the sidewalls has at least a value for contacting the sidewall insulating layers to each other to form holes between the sidewall insulating layers, and the vias are provided in the holes respectively, and each of the resistance change elements is a magnetoresistive element including magnetic layers.

14. The memory of claim 13,
wherein each of the sidewall insulating layers includes a first layer comprising a first material and a second layer comprising a second material different from the first material.

15. The memory of claim 14,
wherein the first layer contacts with one of the elements and prevents an oxidation thereof, and the second layer has a dielectric constant lower than that of the first layer.

16. The memory of claim 14,
wherein the first and second materials are selected from a group of silicon nitride, boron nitride, aluminium nitride, silicon oxide, aluminium oxide, magnesium oxide, hafnium oxide, lanthanum oxide, zirconium oxide and yttrium oxide.

17. The memory of claim 13, further comprising:
a first FET connected between a first element and a first via adjacent to each other in the first direction among the elements and the vias;
a second FET connected between a second element and a second via adjacent to each other in the first direction among the elements and the vias;
a first word line connected to a gate of the first FET, and extending to the second direction;
a second word line connected to a gate of the second FET, and extending to the second direction;
a first upper electrode connected to the first element;
a second upper electrode connected to the first via and the second element;
a third upper electrode connected to the second via;
a first bit line connected to the first and third upper electrodes, and extending the first direction; and
a second bit line connected to the second upper electrode, and extending the first direction,
wherein the first and second elements are adjacent to each other in the constant pitch.

18. The memory of claim 13,
wherein the value for contacting the sidewall insulating layers to each other is $(\sqrt{2} \times F) - Sm/2,$ where 4 F is the constant pitch, and Sm is a size of each of the elements.

19. The memory of claim 13,
wherein a planer shape of each of the elements is a round shape, and a planer shape of each of the vias is a star shape.

* * * * *